United States Patent [19]

Kojima

[11] Patent Number: 5,369,374
[45] Date of Patent: Nov. 29, 1994

[54] DIFFERENTIAL DETECTION DEMODULATOR

[75] Inventor: Toshiharu Kojima, Kamakura, Japan

[73] Assignee: Mitsubishi Denki Kabushiki Kaisha, Tokyo, Japan

[21] Appl. No.: 219,020

[22] Filed: Mar. 28, 1994

Related U.S. Application Data

[62] Division of Ser. No. 997,768, Dec. 24, 1992, Pat. No. 5,313,170.

[30] Foreign Application Priority Data

Dec. 27, 1991 [JP] Japan ................... 3-347245
Mar. 12, 1992 [JP] Japan ................... 4-053583
Mar. 25, 1992 [JP] Japan ................... 4-067124

[51] Int. Cl.$^5$ ........................................ H04L 27/22
[52] U.S. Cl. ................................. 329/306; 329/310; 375/82; 375/84
[58] Field of Search .............. 329/304, 305, 306, 310; 375/80, 82, 83, 84, 85

[56] References Cited

U.S. PATENT DOCUMENTS 4,804,925 2/1989 Iwase et al. ................... 329/310
5,097,220 3/1992 Shimakata et al. ............ 329/306

FOREIGN PATENT DOCUMENTS 0008491 3/1980 European Pat. Off. .
2644952 9/1990 France .

*Primary Examiner*—Siegfried H. Grimm
*Attorney, Agent, or Firm*—Wolf, Greenfield & Sacks

[57] ABSTRACT

Within the differential detection demodulator, the received signal is first quantized by a limiter amplifier 10 and then subjected to frequency conversion by a frequency converter 50 including: an exclusive OR element 51; a running average generator 52 consisting of a shift register 53 and an adder 54; and a comparator 55. In response to the output of the frequency converter 50, the phase comparator 60 outputs a relative phase signal representing the phase shift of the received signal after frequency conversion relative to a phase reference signal. The phase comparator 60 includes: an exclusive OR element 61; an absolute phase shift measurement circuit 62 consisting of an adder 63 and D flip-flop arrays 64 and 65; and a D flip-flop 66 serving as a phase shift polarity decision circuit. Alternatively, the phase detection circuit 400 for generating the relative phase signal may include: a half-period detection circuit 901 consisting of a delay element 401 and an exclusive OR element 402; a phase reference signal generation circuit 902 consisting of a modulo 2N counter 403; and a phase shift measurement circuit 903 consisting of a phase inversion corrector 500 and a D flip-flop array 404. The delay element 40 delays the relative phase signal by one symbol period and the subtractor 41 outputs the phase difference signal representing the phase transition over each symbol period of the received signal. The decision circuit 42 obtains The demodulated data from the phase difference signal.

12 Claims, 21 Drawing Sheets

FIG. 5

LAGGED PHASE

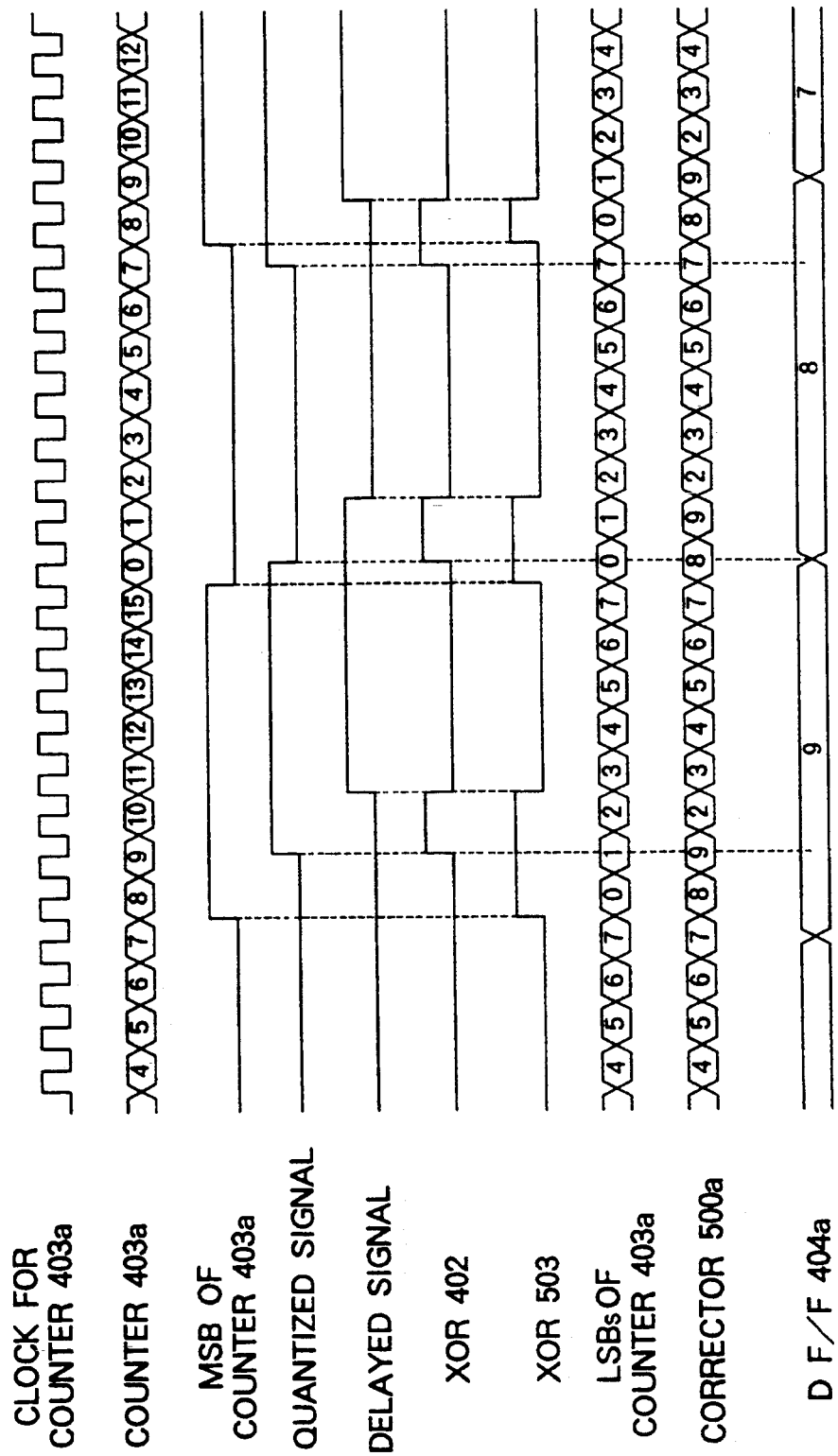

DIFFERENTIAL DETECTION DEMODULATOR

This application is a division of application Ser. No. 07/997,768, filed Dec. 24, 1992 and now U.S. Pat. No. 5,313,170.

BACKGROUND OF THE INVENTION

This invention relates to differential detection demodulators used in the radio communication systems, and more particularly to the improvements in the frequency converter and the phase comparator or the phase detection circuit used in the differential detection demodulators.

A conventional differential detection demodulator provided with a frequency converter and a phase comparator is disclosed, for example, in Japanese Laid-Open Patent (Kokai) No. 64-12646, "DPSK demodulation system". Next, this differential detection demodulator is described by reference to FIG. 8.

In FIG. 8, the frequency converter 20 includes a multiplier 21 and a low pass filter 22. The phase comparator 30 includes: a phase shifter 31 for shifting the phase of the local carrier (the phase reference signal) by $\pi/2$ radians; a multiplier 32 for multiplying the local carrier by the output of the low pass filter 22; a multiplier 33 for multiplying the output of the phase shifter 31 by that of the low pass filter 22; a low pass filter 34 for eliminating the high frequency components from the output of the multiplier 32; a low pass filter 35 for eliminating the high frequency components from the output of the multiplier 33; a sampler 36 for sampling the output of the low pass filter 34; a sampler 37 for sampling the output of the low pass filter 35; and a coordinate converter 38 for calculating and generating a relative phase signal from the outputs of the samplers 36 and 37. A delay element 40 delays the relative phase signal by one symbol period of the received signal. A subtractor 41 subtracts, in modulo $2\pi$, the relative phase signal delayed by one symbol period by the delay element 40 from the relative phase signal directly output from the coordinate converter 38. A decision circuit 42 outputs the demodulated data according to the values of phase transition over each symbol period of the received signal.

Next the operation of the circuit of FIG. 8 is described in detail. It is a common practice in the field of demodulators to convert the frequencies of the received signal to low frequencies using a frequency converter. This facilitates subsequent signal processing. The received signal is a differential phase shift keying (DPSK) signal. This received signal is input to the frequency converter 20, where the multiplier 21 multiplies it by the signal for frequency conversion. It is assumed that the frequency of the received signal is $f_1$ Hz and that of the frequency conversion signal $f_2$ Hz. Then the multiplied signal output from the multiplier 21 includes a high frequency component at $f_1+f_2$ Hz and a low frequency component at $|f_1-f_2|$ Hz. This multiplied signal output from the multiplier 21 is supplied to the low pass filter 22, where the high frequency component is suppressed and only the low frequency component at $|f_1-f_2|$ Hz is passed. The received signal thus undergoes the frequency conversion.

After being subjected to the frequency conversion by the frequency converter 20, the received signal is processed by the phase comparator 30. The multiplier 32 multiplies the received signal after the frequency conversion (output from the frequency converter 20) by the phase reference signal (the local carrier). The low pass filter 34 eliminates the high frequency components from the output of the multiplier 32, thereby obtaining the baseband signal in phase with the local carrier (referred to as the in-phase baseband signal).

The phase shifter 31 shifts the phase of the phase reference signal or the local carrier by $\pi/2$ radians. The multiplier 33 multiplies the received signal after the frequency conversion (output from the frequency converter 20) by the output of the phase shifter 31. The low pass filter 35 eliminates the high frequency components from the output of the multiplier 33, thereby obtaining the baseband signal in quadrature with the local carrier (referred to as the quadrature baseband signal).

The in-phase baseband signal output from the low pass filter 34 is sampled by the sampler 36 and supplied to the coordinate converter 38. Similarly, the quadrature baseband signal output from the low pass filter 35 is sampled by the sampler 37 and supplied to the coordinate converter 38. The coordinate converter 38 outputs the relative phase signal representing the phase shift of the received signal after frequency conversion relative to the local carrier, i.e. the phase reference signal. The value of the relative phase signal $\theta$ is expressed by the values x and y of the sampled in-phase and quadrature baseband signals as follows:

$$\theta = \tan^{-1}(x/y)$$

The relative phase signal output from the coordinate converter 38 is supplied to the subtractor 41 and the delay element 40. At the delay element 40 the relative phase signal is delayed by one symbol period of the received signal and then is supplied to the subtractor 41. The subtractor 41 subtracts, in modulo $2\pi$, the output of the delay element 40 from the output of the coordinate converter 38, and thereby obtains the phase shift difference signal (abbreviated hereinafter to phase difference signal).

The phase difference signal output from the subtractor 41 represents the phase transition over each symbol period of the received signal. Upon receiving the phase difference signal from the subtractor 41, the decision circuit 42 obtains the demodulated data on the basis of the predetermined correspondence relationship between the phase difference signal and the demodulated data.

The above conventional differential detection demodulator has the following disadvantage. Since the frequency converter and the phase comparator circuits are composed of analog parts, integration of circuit parts into ICs is difficult. Thus, the adjustment or tuning of the circuits is indispensable. Further, it is difficult to reduce the size and the power consumption of the circuit.

SUMMARY OF THE INVENTION

It is therefore an object of this invention to provide a differential detection demodulator provided with a frequency converter and a phase comparator consisting of digital circuit elements, such that the circuit can easily be integrated into ICs and hence the adjustment of the circuits can be dispensed with and the size and the power consumption can be reduced.

The above object is accomplished in accordance with the principle of this invention by a frequency converter circuit for converting a frequency of a first 2-level quantized signal using a second 2-level quantized signal having a frequency distinct from the frequency of the first signal, comprising: an exclusive OR element for obtaining a logical exclusive OR of the first and second signal; running average generator means, coupled to the exclusive OR element, for generating a signal corresponding to k times running average of an output of the exclusive OR element, k being a positive integer; and hard decision means, coupled to the running average generator means, for converting an output of the running average generator means to a 2-level logical signal.

Preferably, the running average generator means comprises: a shift register coupled to the exclusive OR element and having (2n+1) stages to hold respective bits, where n is a positive integer and the output of the exclusive OR element is first supplied to a first stage of the shift register, the shift register shifting the bits held in the stages from the first toward (2n+1)th stage in synchronism with a clock signal having a period shorter than periods of the first and second signals; and an adder means coupled to the shift register, for adding bits of the respective stages of the shift register, wherein an output of the adder constituting the output of the running average generator means.

It is still preferred that the running average generator means comprises: a shift register coupled to the exclusive OR element and having (2n+2) stages to hold respective bits, where n is a positive integer and the output of the exclusive OR element is first supplied to a first stage of the shift register, the shift register shifting the bits held in the stages from the first toward (2n+2)th stage in synchronism with a clock signal having a period shorter than periods of the first and second signals; a sign invertor coupled to the shift register, for inverting a polarity of an output bit of the (2n+2)th stage; an adder coupled to the first stage of the shift register and the sign invertor; and a delay element having an input coupled to an output of the adder and having an output coupled to an input of the adder, the delay element delaying the output of the adder in synchronism with the clock of the shift register; wherein the adder adds outputs of: the first stage of the shift register; the sign invertor; and the delay element, the output of the delay element constituting the output of the running average generator means.

Preferably, the hard decision means compares the output of the running average generator means with a predetermined threshold level to convert the output of the running average generator means to the 2-level logical signal.

The above object of this invention is also accomplished by a phase comparator for determining a phase shift of a 2-level received signal relative to a phase reference signal having a fixed frequency practically equal to a frequency of the received signal, the phase comparator comprising: an exclusive OR element for obtaining a logical exclusive OR of the received signal and the phase reference signal; absolute phase shift measurement means coupled to the exclusive OR element, for determining a duration in which an output of the exclusive OR element is sustained at a logical "1" during each half period of the phase reference signal; and phase shift polarity decision means coupled to the exclusive OR element, for decision whether the phase of the received signal is lagged or led with reference to the phase reference signal, on the basis of a value of the exclusive OR element at each half period of the phase reference signal; wherein a combination of outputs of the absolute phase shift measurement means and the phase shift polarity decision means represents the phase shift of the received signal relative to the phase reference signal.

Preferably, the absolute phase shift measurement means comprises: an adder coupled to the exclusive OR element; and a delay element having an input coupled to an output of the adder and having an output coupled to an input of the adder, the delay element delaying the output of the adder in synchronism with a clock having a period shorter than the period of the phase reference signal, the delay element being reset at each half period of the phase reference signal; wherein the adder adds outputs of the exclusive OR element and the delay element to obtain a value corresponding to the duration in which the output of the exclusive OR element is sustained at a logical "1" during each half period of the phase reference signal.

The differential detection demodulator according to this invention for demodulating a 2-level received signal using a phase reference signal having a fixed frequency practically equal to a frequency of the received signal, the differential detection demodulator comprises: a phase comparator including: an exclusive OR element for obtaining a logical exclusive OR of the received signal and the phase reference signal; absolute phase shift measurement means coupled to the exclusive OR element, for measuring a duration in which an output of the exclusive OR element is sustained at a logical "1" during each half period of the phase reference signal; and phase shift polarity decision means coupled to the exclusive OR element, for decision whether the phase of the received signal is lagged or led with reference to the phase reference signal, on the basis of an output value of the exclusive OR element at each half period of the phase reference signal; wherein a combination of outputs of the absolute phase shift measurement means and the phase shift polarity decision means constituting a relative phase signal output from the phase comparator; a delay element coupled to the phase comparator, for delaying the relative phase signal output from the phase comparator by one symbol period of the received signal; and a subtractor coupled to the phase comparator and the delay element, for subtracting an output of the delay element from the relative phase signal.

Alternatively, the differential detection demodulator according to this invention for demodulating a first 2-level signal using a phase reference signal having a fixed frequency practically equal to a frequency of the first signal, the differential detection demodulator comprises: a frequency converter circuit for converting the frequency of the first signal using a second 2-level signal having a frequency distinct from the frequency of the first signal, including: an exclusive OR element for obtaining a logical exclusive OR of the first and second signal; running average generator means, coupled to the exclusive OR element, for generating a signal corresponding to k times running average of an output of the exclusive OR element, k being a positive integer; and hard decision means, coupled to the running average generator means, for converting an output of the running average generator means to a 2-level logical signal, an output of the hard decision means constituting an output of the frequency converter; a phase comparator including: an exclusive OR element coupled to the hard decision means of the frequency converter, for obtaining a logical exclusive OR of the output, the frequency converter, and the phase reference signal; absolute phase shift measurement means coupled to the exclusive OR element, for measuring a duration in which an output of the exclusive OR element is sustained at a logical "1" during each half period of the phase reference signal; and phase shift polarity decision means coupled to the exclusive OR element, for decision whether the phase of the first signal is lagged or led with reference to the phase reference signal, on the basis of an output value of the exclusive OR element at each half period of the phase reference signal; wherein a combination of outputs of the absolute phase shift measurement means and the phase shift polarity decision means constituting a relative phase signal output from the phase comparator; a delay element coupled to the phase comparator, for delaying the relative phase signal output from the phase comparator by one symbol period of the first signal; and a subtractor coupled to the phase comparator and the delay element for subtracting an output of the delay element from the relative phase signal.

The phase detection circuit according to this invention for detecting a phase shift of an input signal relative to a phase reference signal, comprises: half-period detector means for generating, in response to the input signal, a half-period detection signal at each half-period of the input signal; phase reference signal generator means for generating the phase reference signal in response to a clock signal having a frequency not less than twice a frequency of the input signal; and phase shift determiner means, coupled to the half-period detector means and phase reference signal generator means and including phase inversion corrector means for correcting the phase reference signal for a phase inversion thereof at each alternate half-period of the input signal, the phase shift determiner means determining and outputting a phase shift of the input signal with respect to the phase reference signal at each half-period of the input signal, on the basis of the phase reference signal corrected by the phase inversion corrector means and the half-period detection signal output from the half-period detector means.

Preferably, the half-period detector means includes: a delay element for delaying the input signal by a delay time shorter than the half-period of the input signal; and a first exclusive OR element for generating a logical exclusive OR of the input signal and an output of the delay element; the phase reference signal generator means includes a counter for counting in modulo 2N a clock signal having a frequency practically equal to 2N times the frequency of the input signal, where N is a positive integer; the phase inversion corrector means adds a numerical value "0" or "N" in modulo 2N to an output of the counter in response to the output of the delay element in the half-period detector means; and the phase shift determiner means includes, in addition to the phase inversion corrector means, a D flip-flop array coupled to the phase inversion corrector means and the exclusive OR element in the half-period detector means, the D flip-flop array holding an output of the phase inversion corrector means in response to the logical exclusive OR output of the exclusive OR element, wherein a value held in the D flip-flop array constitutes an output of the phase shift determiner means.

Further, the phase inversion corrector means may include: a multiplier coupled to the delay element, for multiplying the output of the delay element by N; and an adder coupled to the counter and the multiplier, for adding an output of the multiplier to the output of the counter in modulo 2N.

Alternatively, the phase inversion corrector means may include: a data selector coupled to the delay element, for selecting a numerical value "0" when the output of the delay element is at logical "0", and a numerical value "1" when the output of the delay element is at logical "1"; and an adder coupled to the counter and the data selector, for adding an output of the data selector to the output of the counter in modulo 2N.

Still alternatively, the phase inversion corrector means may include: logical product elements coupled to the delay element, for generating logical products of the output of the delay element and respective bits of a numerical value "N"; and an adder coupled to the counter and the logical product elements, for adding outputs of the logical product elements with the output of the counter in modulo 2N.

Preferably, the counter counts a clock signal having a frequency practically equal to $2^M$ times the frequency of the input signal, where M is a positive integer; and the phase inversion corrector means includes a second exclusive OR element coupled to the output of the delay element in the half-period detector means and a most significant bit of the output of the counter, the second exclusive OR element generating a logical exclusive OR of the output of the delay element and the most significant bit of the output of the counter, wherein an output of the phase inversion corrector means consists of a combination of least significant bits of the output of the modulo 2N counter and the logical exclusive OR output of the second exclusive OR element.

The method according to this invention for detecting a phase shift of an input signal relative to a phase reference signal, comprises the steps of: generating, in response to the input signal, a half-period detection signal at each half-period of the input signal; generating the phase reference signal in response to a clock signal having a frequency not less than twice a frequency of the input signal; correcting the phase reference signal for a phase inversion thereof at each alternate half-period of the input signal; and determining a phase shift of the input signal with respect to the phase reference signal at each half-period of the input signal, on the basis of the corrected phase reference signal and the half-period detection signal.

BRIEF DESCRIPTION OF THE DRAWINGS

The features which are believed to be characteristic of this invention are set forth with particularity in the appended claims. The structure and method of operation of this invention itself, however, will be best understood from the following detailed description, taken in conjunction with the accompanying drawings, in which:

FIG. 5 is a timing chart showing the same waveforms as those of FIG. 4, occurring when the received signal after the frequency conversion is lagged relative to the phase reference signal;

FIG. 21 is a view similar to that of FIG. 19, but showing the case where the relative phase of the 2-level quantized received signal with respect to the virtual phase reference signal is increasingly led.

In the drawings, like reference numerals represent like or corresponding parts or portions.

DETAILED DESCRIPTION OF THE PREFERRED EMBODIMENTS

Referring now to the accompanying drawings, the preferred embodiments of this invention are described.

Figure 1:
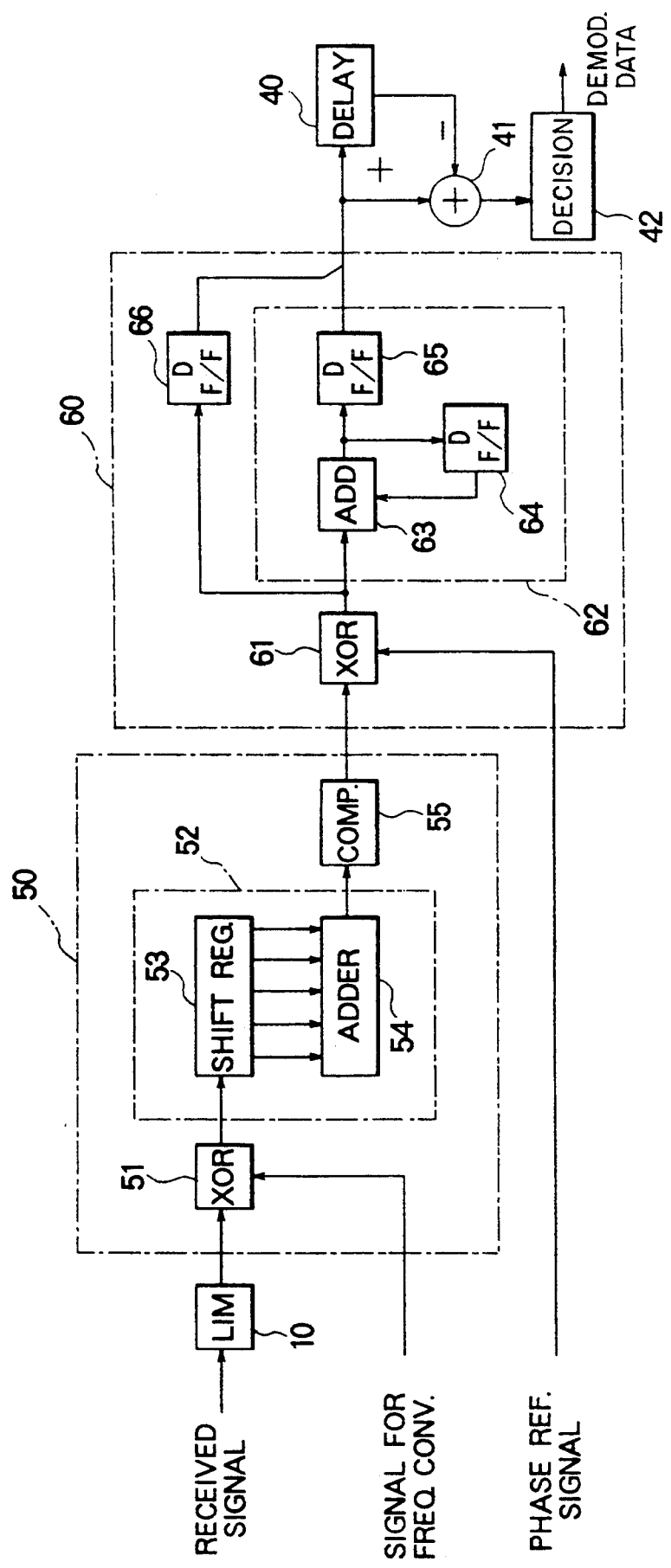
FIG. 1 is a block diagram showing the circuit structure of a differential detection demodulator provided with a frequency converter and a phase comparator according to this invention.

FIG. 1 is a block diagram showing the circuit structure of a differential detection demodulator provided with a frequency converter and a phase comparator according to this invention. A limiter amplifier 10 subjects the received signal to a 2-level quantization. A frequency converter 50 coupled to the limiter amplifier 10 effects a frequency conversion on the 2-level quantized received signal output from the limiter amplifier 10. The frequency converter 50 is organized as follows. An exclusive OR element 51 is coupled to the limiter amplifier 10 to obtain the logical exclusive OR of the output of the limiter amplifier 10 and the signal for frequency conversion (the frequency conversion signal). A running average generator 52 removes the high frequency components from the output of the exclusive OR element 51. The running average generator 52 includes: a shift register 53 for sequentially delaying the output of the exclusive OR element 51; and an adder 54 for adding the output bits of the shift register 53. A comparator 55 coupled to the adder 54 compares the output of the adder 54 with a predetermined threshold value.

Further, a phase comparator 60 is coupled to the frequency converter 50 to compare the phase of output of the frequency converter 50 (the received signal after frequency conversion) and the phase of the phase reference signal. The phase comparator 60 is organized as follows. An exclusive OR element 61 coupled to the comparator 55 effects the logical exclusive OR operation upon the output of the comparator 55 and the phase reference signal. In response to the output of the exclusive OR element 61, an absolute phase shift measurement means 62 determines the absolute value of the phase shift of the received signal after frequency conversion relative to the phase reference signal. The absolute phase shift measurement means 62 includes an adder 63 coupled to the exclusive OR element 61 and a pair of D flip-flops 64 and 65 coupled to the adder 63. The output of the D flip-flop array 64, delaying the output of the adder 63, is returned to the adder 63. The adder 63 adds the outputs of the exclusive OR element 61 and the D flip-flop array 64. The D flip-flop array 65 stores the output of the adder 63. The phase comparator 60 further includes a D flip-flop 66. In response to the output of the exclusive OR element 61, the D flip-flop 66 decides whether the phase of the received signal after frequency conversion is led or lagged relative to the phase reference signal. The bits output from the D flip-flops 65 and 66 are combined to obtain the output of the phase comparator 60 (i.e., the relative phase signal).

The output of the phase comparator 60 is supplied to the subtractor 41 and the delay element 40. At the delay element 40 the relative phase signal is delayed by one symbol period of The received signal and then is supplied to the subtractor 41. The subtractor 41 subtracts, in modulo $2\pi$, the output of the delay element 40 from the output of the phase comparator 60, and thereby obtains the phase difference signal. The decision circuit 42 obtains the demodulated data on the basis of the predetermined correspondence relationship between the phase difference signal and the demodulated data.

Next, the operation of the circuit of FIG. 1 is described in detail. First, the limiter amplifier 10 shapes the received signal into a rectangular waveform of a constant amplitude. Namely, the limiter amplifier 10 acts as a 2-level quantizer for subjecting the received signal to the 2-level quantization, such that the output of the limiter amplifier 10 is quantized to logical "0" and "1".

The 2-level quantized output of the limiter amplifier 10 is supplied to the frequency converter 50, where the exclusive OR element 51 effects the logical exclusive OR operation upon the output of the limiter amplifier 10 and the signal for frequency conversion (the frequency conversion signal) which also takes either the logical value "0" or "1". By the way, it is noted that if the logical values "0" and "1" are converted to numerical values "1" and "−1", respectively, then the exclusive OR operation corresponds to the multiplication operation of corresponding numbers. Therefore, the exclusive OR element 51 acts as a multiplier for multiplying the output of the limiter amplifier 10 (the 2-level quantized received signal) by the signal for frequency conversion.

The output of the exclusive OR element 51 is then supplied to the shift register 53 having $(2n+1)$ stages to hold respective bits, where n is a positive integer. The frequency of the clock signal supplied to the shift register 53 is assumed to be higher than the frequency of the output of the limiter amplifier 10 and the frequency of the signal for frequency conversion. The $(2n+1)$ bits output from the respective stages of the shift register 53 are supplied to the adder 54.

Let the period of the clock for the shift register 53 be Tc. Further, let the value of the output of the exclusive OR element 51 at the time $t = i \cdot Tc$ be represented by a0i, where i is an integer and a0i is either "0" or "1": a0i $\in$ {0, 1}. Furthermore, let the value of the mth bit of the shift register 53 at time $t = i \cdot Tc$ be $a_{mi}$, where m = 1, ... (2n+1), i is an integer, and $a_{mi}$ is either "0" or "1"; $a_{mi}$ $\in$ {0,1}. Then, $$a_{mi} = a0_{(i-m)}$$

Thus, the output $b_i$ of the adder 54 at the time $t = i \cdot Tc$ is given by:

$$b_i = \sum_{m=1}^{2n+1} a_{mi} = \sum_{m=1}^{2n+1} a0_{(i-m)}$$

Namely, the output $b_i$ of the adder 54 at the time $t = i \cdot Tc$ is equal to $(2n+1)$ times the average of the $(2n+1)$ sequentially shifted values: $a0_{(i-1)} \ldots a0_{(i-2n-1)}$, of the output of the exclusive OR element 51. The output of the adder 54 constitutes the output of the running average generator 52, which is supplied to the comparator 55.

The comparator 55 compares the output of the running average generator 52 with the constant n. Depending on the value $b_i$ of the output of the running average generator 52 and the constant n, the value $d_i$ of the output signal of the comparator 55 is given as follows:

$$d_i = \begin{matrix} 0 \ (b_i \leq n) \\ 1 \ (b_i > n) \end{matrix}$$

Namely, the comparator 55 acts as a hard decision means for converting the output $b_i$ of the running average generator 52 into a 2-level signal which takes either of the two logical values "0" and "1".

The signal processing within the frequency converter 50 thus converts the frequency of the 2-level quantized received signal (output of the limiter amplifier 10). Namely, if the frequency of the 2-level quantized received signal is represented by $f_1$ Hz, that of the signal for frequency conversion by $f_2$ Hz, then the frequency of the received signal after frequency conversion (the output of the frequency converter 50) is: $|f_1 - f_2|$ Hz.

Figure 2:
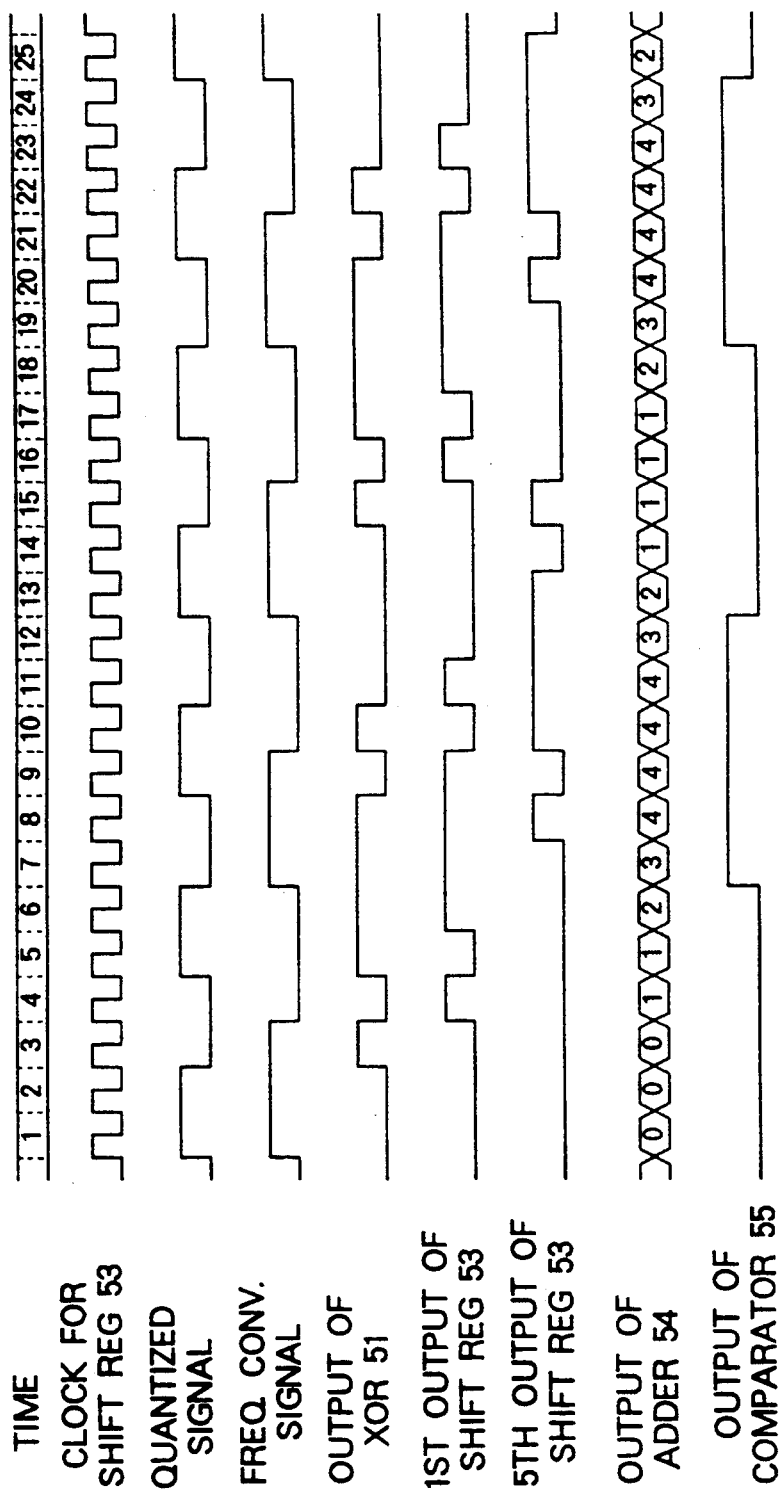
FIG. 2 is a timing chart showing waveforms within the frequency converter in the case where the shift register has five stages to hold respective bits.

Next, this is described in detail by reference to the waveform diagrams. FIG. 2 is a timing chart showing waveforms within the frequency converter 50 in the case where the shift register 53 has five stages to hold respective bits, namely where n=2. At the top row is shown the time scale as measured by the periods of the clock for shift register 53 (the first through 25th periods). The waveforms shown below the time scale are, from top to bottom: the clock supplied to the shift register 53; the output of the limiter amplifier 10 (the 2-level quantized received signal); the signal for frequency conversion (the frequency conversion signal); the output of the exclusive OR element 51; the first bit of the shift register 53; the fifth bit of the shift register 53; the output of the adder 54 (the inserted numbers representing the values of the output); and the output of the comparator 55. It is assumed that all the five bits of the shift register 53 are at logical "0" at time "1".

Let the frequency of the clock supplied to the shift register 53 be $f_0$ Hz. Further, the frequency $f_1$ of the 2-level quantized received signal (the output of the limiter amplifier 10 supplied to the frequency converter 50) and the frequency $f_2$ of the signal for frequency conversion are given by:

$$f_1 = f_0/4$$

$$f_2 = f_0/6$$

Then, the frequency $f_3$ of the output of comparator 55 (i.e., the output of the frequency converter 50) is given by:

$$f_3 = f_0/12$$

From the above three equations, the frequency $f_3$ of the output of the frequency converter 50 (the received signal after frequency conversion), the frequency $f_1$ of the output of the limiter amplifier 10 (the 2-level quantized received signal), and the frequency $f_2$ of the signal for frequency conversion satisfy:

$$f_3 = f_0/12 = f_0/4 - f_0/6 = f_1 - f_2$$

Further, since the commutative law holds for the logical exclusive OR operation, the waveforms of the 2-level quantized received signal and the frequency conversion signal (the signal for frequency conversion) can be interchanged without affecting the waveforms of the output waveforms of the exclusive OR element 51, the shift register 53, the adder 54 and the comparator 55. Under such circumstances, the frequency $f_0$ of the clock signal for the shift register 53, the frequency $f_1$ of the 2-level quantized received signal, and the frequency $f_2$ of the signal for frequency conversion satisfy:

$$f_1 = f_0/6$$

$$f_2 = f_0/4$$

Thus, the frequency $f_3$ of the received signal after frequency conversion are expressed in terms of the frequencies $f_1$ and $f_2$ as follows:

$$f_3 = f_0/12 = f_0/4 - f_0/6 = f_2 - f_1$$

The above relations can thus be summarized by the equation:

$$f_3 = |f_1 - f_2|$$

In FIG. 2, the output of the exclusive OR element 51 includes a high frequency component at $f_0/2$ Hz. However, the output of the comparator 55 does not include such high frequency components. Namely, the running average generator 52 consisting of the shift register 53 and the adder 54, and the comparator 55 acting as the hard decision means for converting the output of the running average generator 52 into a 2-level logical signal, function together as a low pass filter for removing the high frequency components from the output of the exclusive OR element 51.

The output of the frequency converter 50 (the received signal after the frequency conversion) is supplied to the phase comparator 60. The exclusive OR element 61 effects the exclusive OR operation upon the received signal after the frequency conversion and the phase reference signal which is a 2-level signal taking either the logical "0" or "1". As in the case of the exclusive OR element 51 within the frequency converter 50, the exclusive OR element 61 acts as a multiplier for multiplying the received signal after the frequency conversion by the phase reference signal.

The duration during which the output of the exclusive OR element 61 is continuously sustained at the logical "1" is proportional to the absolute value of the phase shift of the received signal after the frequency conversion relative to the phase reference signal. Next this is described in detail by reference to waveforms.

Figure 3:
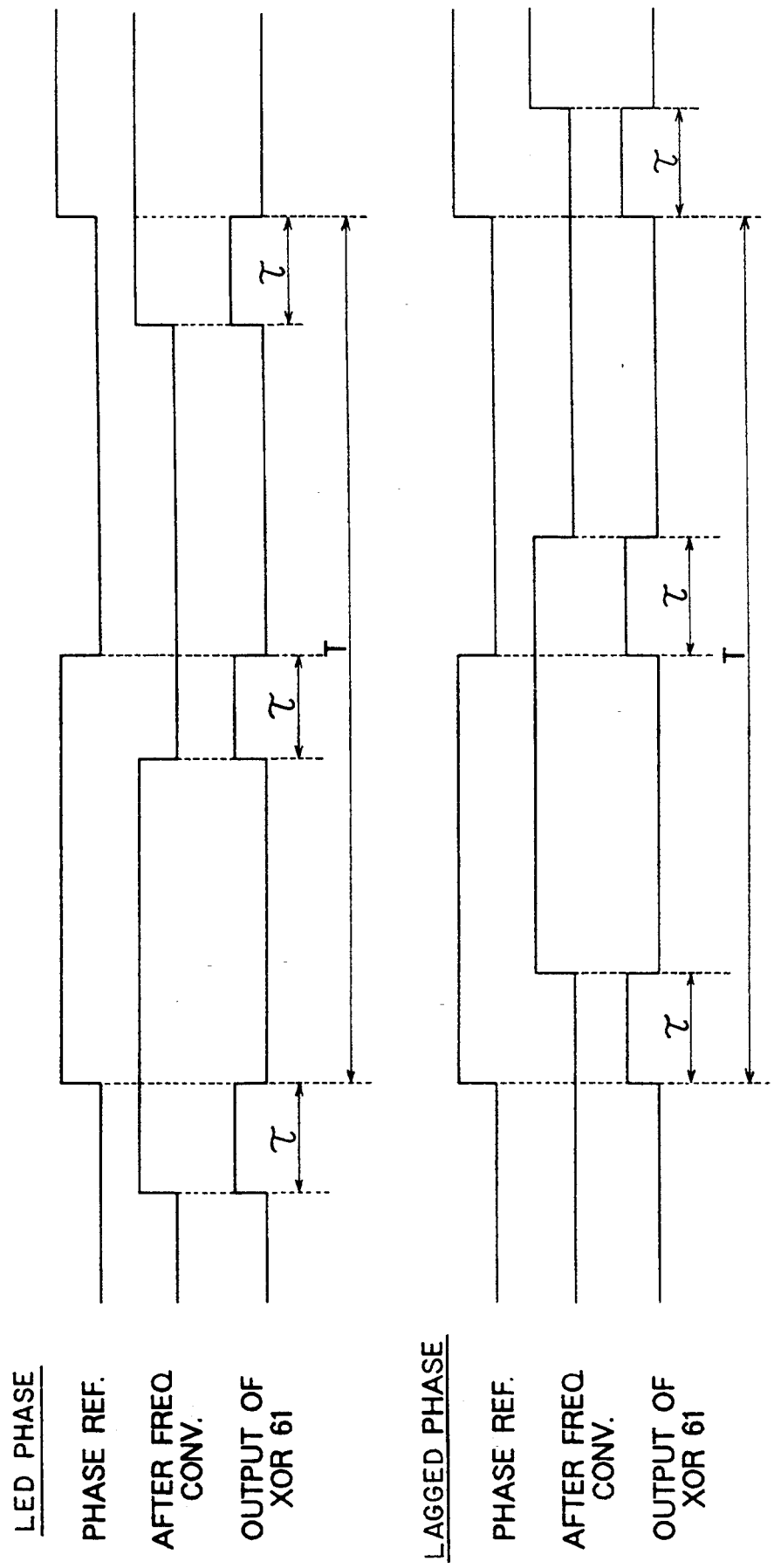
FIG. 3 is a timing chart showing the waveforms of the phase reference signal, the received signal after the frequency conversion, and the output of the exclusive OR element 61 of FIG. 1, in the two cases where the received signal after frequency conversion is led (shown above) and lagged (shown below) with respect to the phase reference signal.

FIG. 3 is a timing chart showing the waveforms of the phase reference signal, the received signal after the frequency conversion, and the output of the exclusive OR element 61 of FIG. 1, in the two cases where the received signal after frequency conversion is led (shown above) and lagged (shown below) with respect to the phase reference signal. The absolute value of the phase shift $\psi$ of the received signal after frequency conversion relative to the phase reference signal is expressed in terms of: the length of time $\tau$ between the rising or falling edges of the received signal after frequency conversion and the phase reference signal; and the period T of the phase reference signal. Namely, the absolute value of the phase shift $\psi$ is expressed as follows:

$$|\psi| = 2\pi\tau/T$$

As understood from FIG. 3, the time $\tau$ between the rising or the falling edges of the phase reference signal and the received signal after frequency conversion is equal to the time during which the output of the exclusive OR element 61 is continuously sustained at logical "1". Thus, the duration by which the output of the exclusive OR element 61 is sustained at logical "1" is proportional to the absolute value of the phase shift of the received signal after frequency conversion relative to the phase reference signal. Consequently, the absolute value of the phase shift of the received signal after frequency conversion relative to the phase reference signal can be determined by measuring the duration in which the output of the exclusive OR element 61 is continuously sustained at logical "1".

The output of the exclusive OR element 61 is supplied to the absolute phase shift measurement means 62, where the adder 63 adds the outputs of the exclusive OR element 61 and the D flip-flop array 64, the output of the adder 63 being supplied to the D flip-flop array 64 and the D flip-flop array 65.

The frequency of the clock signal supplied to the D flip-flop array 64 is selected at M times the frequency of the phase reference signal, where M is an even number not less than four. The D flip-flop array 64 acts as a delay element for storing the output of the adder 63. Thus, during the time when the output of the exclusive OR element 61 is sustained at "1", the output of adder 63 is incremented by one over each period of the clock signal of the D flip-flop array 64. On the other hand, during the time when the output of the exclusive OR element 61 is at "0", the output of the adder 63 remains constant.

The output of the adder 63 is also input to the D flip-flop array 65. The frequency of the clock signal of the D flip-flop array 65 is two times that of the phase reference signal, the rising edges of the clock of the D flip-flop array 65 coinciding with the rising or the falling edges of the phase reference signal. Further, the D flip-flop array 64 is reset at the rising edge of the clock for the D flip-flop array 65. Namely, the D flip-flop array 64 is reset at each half period of the phase reference signal.

The output of the D flip-flop array 65 is thus equal to the integral part of the duration of logical "1" of the output of the exclusive OR element 61 during each half period of the phase reference signal, as normalized by the periods of the clock signal of the D flip-flop array 64. Namely, the output of the D flip-flop array 65 is obtained by dividing the duration of the logical "1" of the output of the exclusive OR element 61 by the length of the period of the clock signal of the D flip-flop array 64 and then discarding the fractional part of the quotient resulting from the division.

Figure 4:
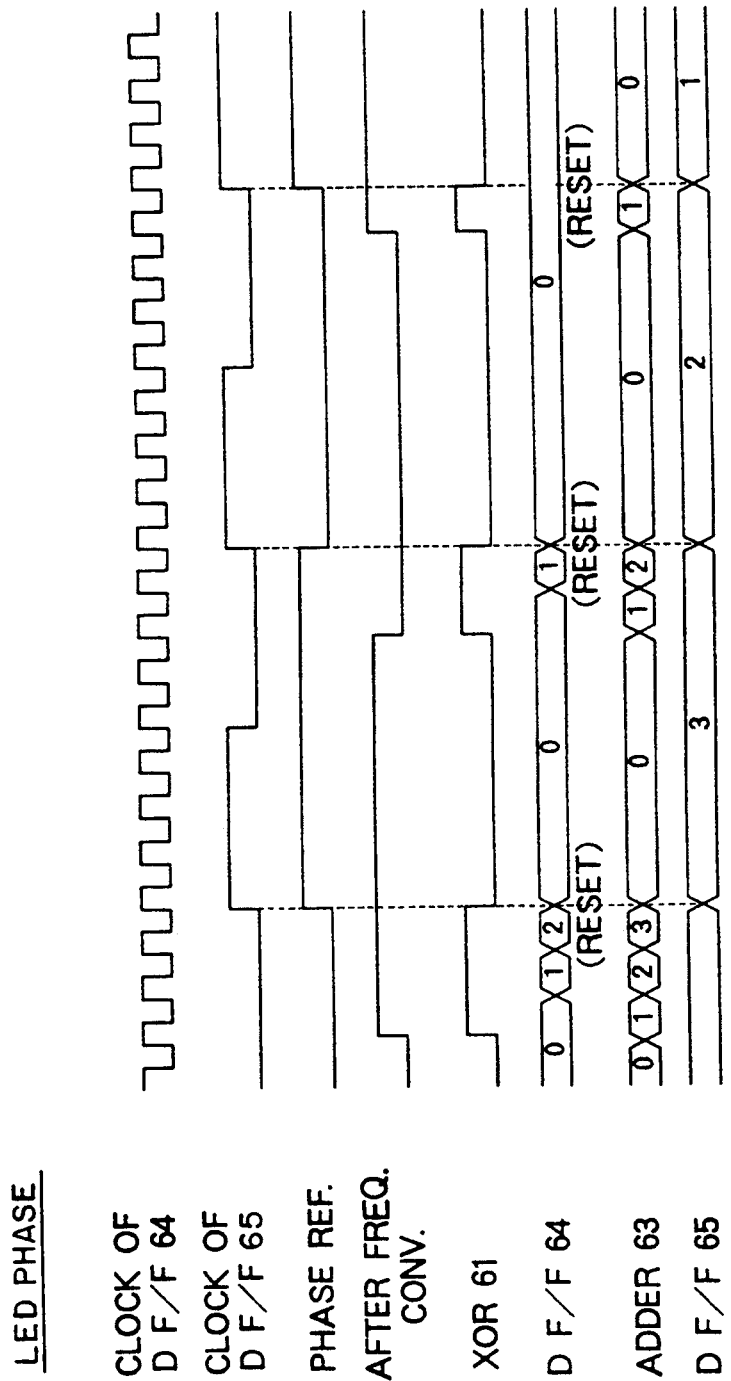
FIG. 4 is a timing chart showing the waveforms occurring within the absolute phase shift measurement means 62 of FIG. 1 when the received signal after the frequency conversion is led relative to the phase reference signal, in the case where the clock frequency of the D flip-flop array 64 is 16 times the frequency of the phase reference signal.
Figure 5:
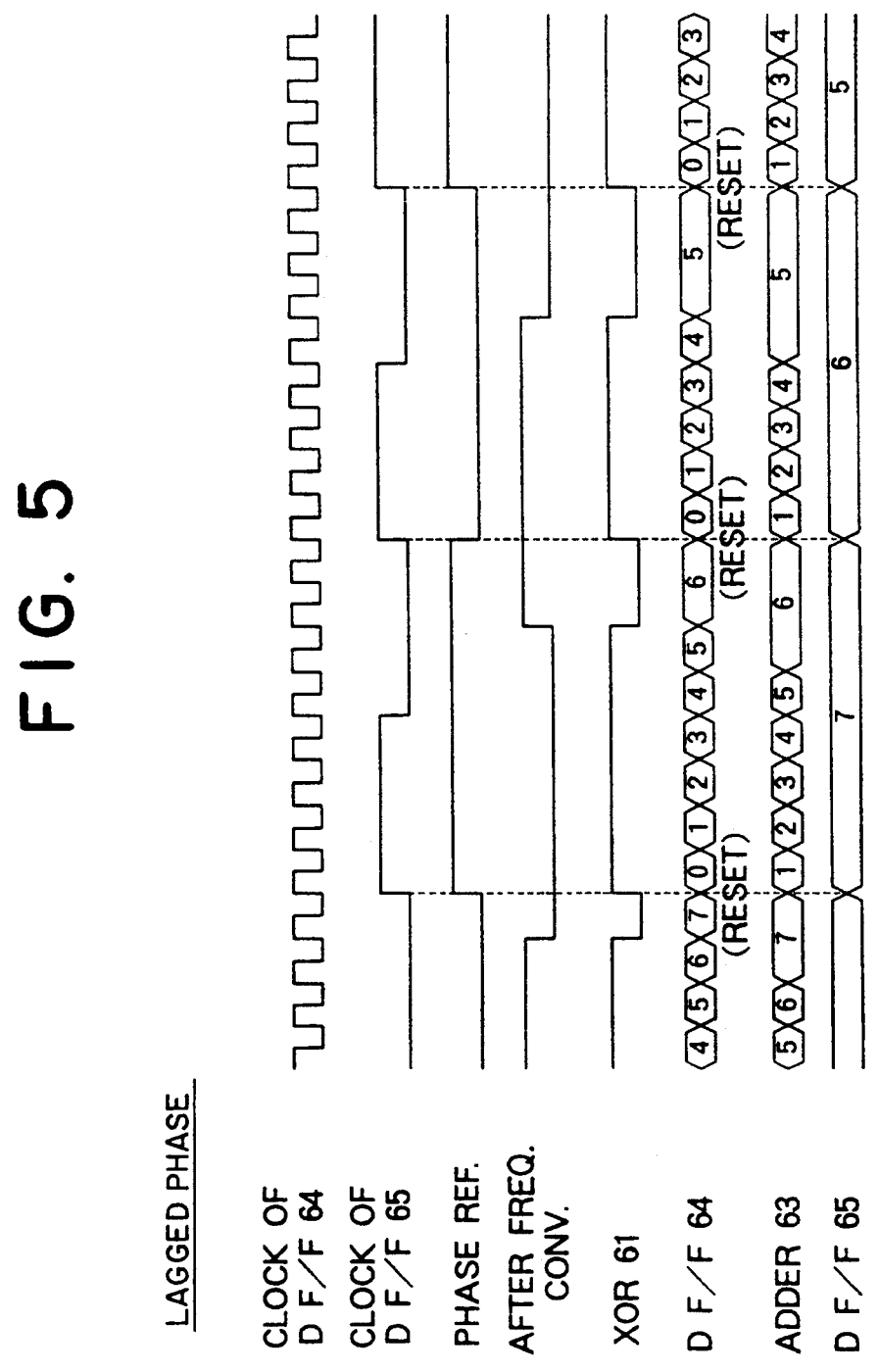

Next, the operation of the absolute phase shift measurement means 62 is described by reference to the waveform diagrams. FIG. 4 is a timing chart showing the waveforms occurring within the absolute phase shift measurement means 62 of FIG. 1 when the received signal after the frequency conversion is led relative to the phase reference signal, in the case where the frequency of clock signal of the D flip-flop array 64 is 16 times the frequency of the phase reference signal (namely, M=16). FIG. 5 is a timing chart showing the same waveforms as those of FIG. 4, occurring when the received signal after the frequency conversion is lagged relative to the phase reference signal. In FIGS. 4 and 5, from top to bottom are shown the waveforms of: the clock supplied to the D flip-flop array 64; the clock supplied to the D flip-flop array 65; the phase reference signal; the received signal after frequency conversion; the output of the exclusive OR element 61; the output of the D flip-flop array 64; the output of the adder 63; and the output of the D flip-flop array 65. The numbers shows at the last three waveforms are the values thereof at respective time intervals.

As described above, the frequency of the clock of the D flip-flop array 65 is two times that of the phase reference signal. Further, the D flip-flop array 64 is reset at respective rising edges of the clock of the D flip-flop array 65. Furthermore, as described above, the output of the D flip-flop array 65 is obtained by normalizing the duration of the logical "1" of the output of the exclusive OR element 61 during each half period of the phase reference signal by the length of the period of the clock signal of the D flip-flop array 64 and then discarding the fractional parts of the normalized value.

Let the value of the output of the D flip-flop array 65 be represented by $\mu$, where $\mu$ is an integer ranging from 0 to M/2 ($\mu \in \{0, 1, \ldots, M/2\}$). Then, the following relationship holds among: the output $\mu$ of the D flip-flop array 65, the ratio M of the frequency of the clock of the D flip-flop array 64 to the frequency of the phase reference signal, and the absolute value of the phase shift $\psi$ of the received signal after frequency conversion relative to the phase reference signal:

$$2\pi\mu/M \leq |\psi| < 2\pi(\mu+1)/M$$

Namely, the value $\mu$ of the output of the absolute phase shift measurement means 62 is approximately equal to the absolute value of the phase shift of the received signal after frequency conversion relative to the phase reference signal, and the error is not greater than $\pm\pi/M$. Thus, by selecting a large value of the ratio M of the frequency of the clock of the D flip-flop array 64 to the frequency of the phase reference signal, the measurement error of the absolute value of the phase shift can be reduced arbitrarily.

The absolute value of the phase shift of the received signal after the frequency conversion relative to the phase reference signal is thus measured by the absolute phase shift measurement means 62. If the sign bit representing the positive or the negative sign is added to the measurement value $\mu$ in correspondence with the phase lag or the phase lead of the received signal after the frequency conversion relative to the phase reference signal, then the phase shift of the received signal after frequency conversion relative to the phase reference signal can adequately be represented.

As comprehended from FIGS. 4 and 5, the value of the output of the exclusive OR element 61 at each rising edge of the clock signal of the D flip-flop array 65 corresponds to the lag or the lead of the phase of the received signal after frequency conversion relative to the phase reference signal.

Namely, in the case of FIG. 4 where the phase of the received signal after frequency conversion is led relative to the phase reference signal, the output of the exclusive OR element 61 at the instant at which the clock signal of the D flip-flop array 65 rises is at logical "1". On the other hand, in the case of FIG. 5 where the phase of the received signal after frequency conversion is lagged relative to the phase reference signal, the output of the exclusive OR element 61 at the instant at which the clock signal of the D flip-flop array 65 rises is at logical "0".

Thus, the output of the exclusive OR element 61 is input to the D flip-flop 66 which is supplied with the same clock signal as the D flip-flop array 65, such that the output of the D flip-flop 66 represents whether the phase of the received signal after frequency conversion is lagged or led relative to the phase reference signal.

Figure 6:
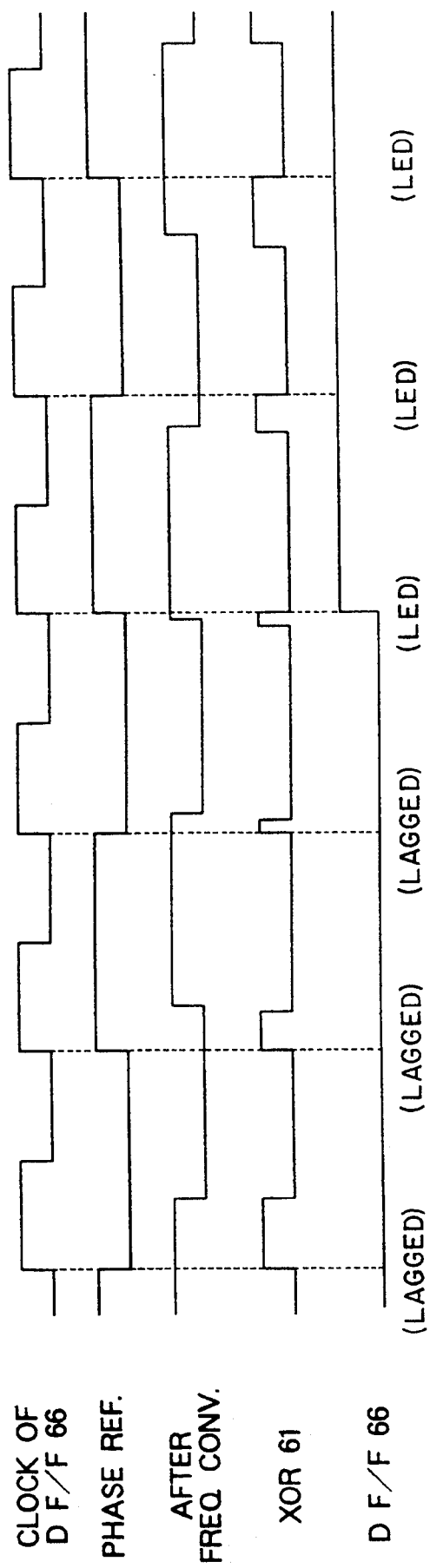
FIG. 6 is a timing chart showing the waveforms related to the operation of the D flip-flop 66 of FIG. 1.

Next, this is described by reference to waveform diagrams. FIG. 6 is a timing chart showing the waveforms related to the operation of the D flip-flop 66 of FIG. 1. From top to bottom in FIG. 6, are shown the waveforms of: the clock supplied to the D flip-flop 66; the phase reference signal; the received signal after frequency conversion; the output of the exclusive OR element 61; and the output of the D flip-flop 66.

As described above the clock of the D flip-flop 66 is the same as the clock of the D flip-flop array 65. Namely, the frequency of the clock of the D flip-flop 66 is two times that of the phase reference signal, the rising edges of the clock of the D flip-flop 66 coinciding with the rising or the falling edges of the phase reference signal.

It can be comprehended from FIG. 6 that when the phase of The received signal after frequency conversion is lagged relative to the phase reference signal, namely when the position of the rising or the falling edge is lagged than the corresponding rising or falling edge of the phase reference signal, the D flip-flop 66 outputs the logical "0" for each half period of the phase reference signal. On the other hand, when the phase of the received signal after frequency conversion is led relative to the phase reference signal, namely when the position of the rising or the falling edge is led than the corresponding rising or falling edge of the phase reference signal, the D flip-flop 66 outputs the logical "1" for each half period of the phase reference signal.

Thus, in response to the output of the exclusive OR element 61, the D flip-flop 66 decides at the edge of each half period of the phase reference signal whether the received signal after frequency conversion is lagged or led relative to the phase reference signal. The output of the D flip-flop 66 constitutes the sign bit representing the polarity of the phase shift of the received signal after frequency conversion relative to the phase reference signal. The output of the D flip-flop 66 is combined with the output of the absolute phase shift measurement means 62 to form together the output of the phase comparator 60.

Thus, the output of the phase comparator 60 is a combination of the outputs of the absolute phase shift measurement means 62 and the D flip-flop 66. The output of the phase comparator 60 is the relative phase signal which represents the phase shift of the received signal after frequency conversion relative to the phase reference signal.

The relative phase signal output from the phase comparator 60 is delayed by the delay element 40 by one symbol period of the received signal, and then is supplied to the subtractor 41. The relative phase signal is also supplied to the subtractor 41 of modulo $2\pi$. Upon receiving the outputs of the phase comparator 60 and the delay element 40, the subtractor 41 subtracts, in modulo $2\pi$, the output of the delay element 40 from the output of the phase comparator 60, and thereby obtains the phase difference signal, which represents the phase transition over each symbol period of the received signal. The phase difference signal output from the subtractor 41 is supplied to the decision circuit 42. The decision circuit 42 obtains the demodulated data corresponding to the value of the phase difference signal, on the basis of the predetermined correspondence relationship between the phase difference signal and the demodulated data.

The above description relates to the case where the received signal is modulated in accordance with the differential phase shift keying (DPSK). This invention can also be applied to MSK or GMSK modulation systems. Further, in the case of the above embodiment, the constant n serving as the parameter of the frequency converter 50 is equal to 2 (n=2) and hence the output of the shift register 53 has five bit stages. However, the constant n may be any positive integer. For example, it may be that n=6 (namely the shift register 53 may have 13 bit stages) or n=7 (namely, the shift register 53 may have 15 bit stages). Furthermore, in the case of the above embodiment, the ratio M of the frequency of the clock of the D flip-flop array 64 to that of the phase reference signal is 16 (M=16). However, the constant M may be any positive even number, such as 32 (M=32) or 64 (M=64).

Figure 7:
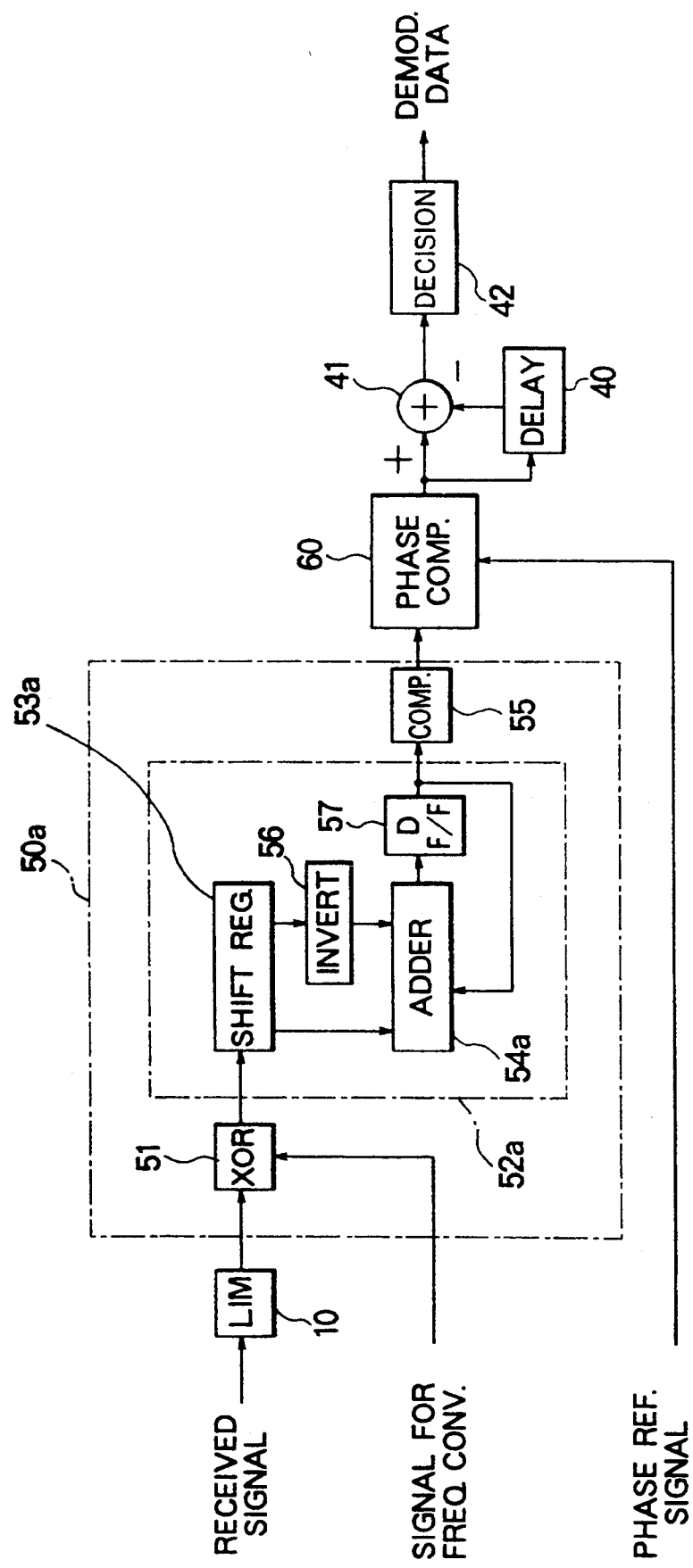
FIG. 7 is a block diagram showing the circuit structure of another differential detection demodulator according to this invention.
Figure 8:
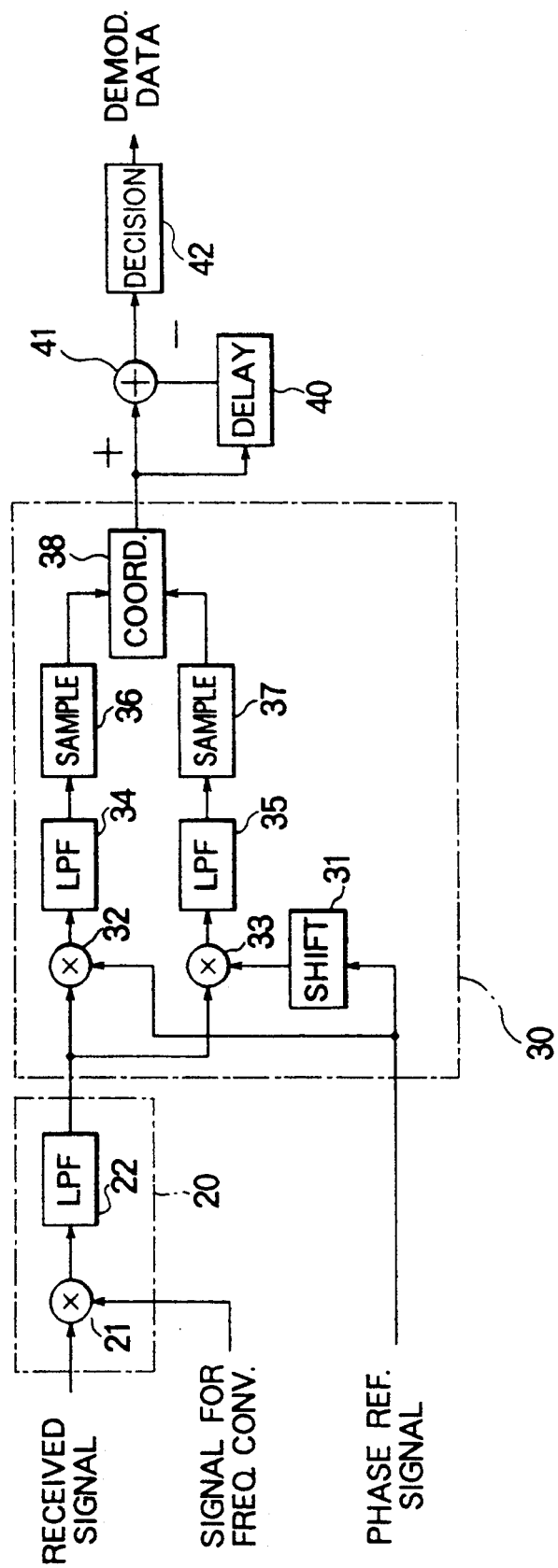
FIG. 8 is a block diagram showing a conventional differential detection demodulator provided with a frequency converter and a phase comparator.

FIG. 7 is a block diagram showing the circuit structure of another differential detection demodulator according to this invention. The circuit is similar to that of FIG. 1 except for the structure of the running average generator 52a of the frequency converter 50a. The running average generator 52a includes: a shift register 53a provided with (2n+2) stages (first through (2n+2)th stages to hold respective bits), where n is a positive integer and the bits are sequentially shifted from the first toward the (2n+2)th bit in synchronism with the clock of the shift register 53a; and an adder 54a for adding the first bit of the shift register 53a and the outputs of a sign invertor 56 and a D flip-flop 57. The sign invertor 56 inverts the polarity of the (2n+2)th bit of the shift register 53a and supplies the result to the adder 54a. The D flip-flop 57 coupled to the output of the adder 54a serves as a delay element for storing the output of the adder 54a. The output of the D flip-flop 57 is supplied to the adder 54a and the comparator 55.

Next, the operation of the circuit of FIG. 7 is described. As in the case of the circuit of FIG. 7, the limiter amplifier 10 quantizes the received signal into a 2-level quantized signal taking either the logical "0" or "1". The 2-level quantized received signal output from the limiter amplifier 10 is supplied to the frequency converter 50a, in which the exclusive OR element 51 effects logical exclusive OR operation upon the output of the limiter amplifier 10 (the 2-level quantized received signal) and the signal for frequency conversion (the frequency conversion signal) which also takes either the logical value "0" or "1". As in the case of the circuit of FIG. 1, the exclusive OR element 51 acts as a multiplier for multiplying the output of the limiter amplifier 10 (the 2-level quantized received signal) by the signal for frequency conversion.

The output of the exclusive OR element 51 is supplied to the first stage of the shift register 53a, from whence it is shifted toward the (2n+2)th stage in synchronism with the clock of the shift register 53a. The frequency of the clock of the shift register 53a is substantially greater than the frequencies of the 2-level quantized received signal and the signal for frequency conversion. The first bit of the shift register 53a is input to the adder 54a. On the other hand, the (2n+2)th bit of the shift register 53a is input to the sign invertor 56, where the sign or polarity of input signal is inverted and then supplied to the adder 54a. The output of the D flip-flop 57 is also supplied to the adder 54a. Thus, the adder 54a adds the first bit of the shift register 53a, the output of the sign invertor 56, and the output of the D flip-flop 57, and outputs the result to the D flip-flop 57. The D flip-flop 57 acts as the delay element for storing the output of the adder 54a. The clock of the D flip-flop 57 be the same as that of the shift register 53a.

Let the output of the D flip-flop 57 and the respective bits of the shift register 53a be at logical "0" at the initial state. Let the period of the clock of the shift register 53a and the D flip-flop 57 be represented by Tc. Further, let the output of the exclusive OR element 51 at the time $t=i \cdot Tc$, where i is an integer, be represented by $a0_i$ ($a0_i \in \{0, 1\}$). Furthermore, let the first and the (2n+2)th bits of the shift register 53a at the time $t=i \cdot Tc$ be represented by $p_i$ and $q_i$ ($p_i \in \{0, 1\}$ and $q_i \in \{0, 1\}$). Then, taking into consideration that all the bits of the shift register 53a are at logical "0" at the initial state (i.e., at the time $t=0$), the following relationships hold, depending upon the value of i:

$$p_i = \begin{array}{ll} 0 & (i = 0) \\ a0_{(i-1)} & (1 \leq i) \end{array}$$

$$q_i = \begin{array}{ll} 0 & (0 \leq i \leq 2n + 1) \\ a0_{(i-2n-2)} & (2n + 2 \leq i) \end{array}$$

As described above the sign invertor 56 inverts the polarity of the (2n+2)th bit output from the shift register 53a. Thus, if the output of the sign invertor 56 at the time $t=i \cdot Tc$ is represented by $r_i$ ($r_i \in \{-1, 0\}$), then $r_i$ is given, depending on the value of i, by:

$$r_i = -q_i = \begin{array}{ll} 0 & (0 \leq i \leq 2n + 1) \\ -a0_{(i-2n-2)} & (2n + 2 \leq i) \end{array}$$

Further, the output $s_i$ of the D flip-flop 57 at the time $t=i \cdot Tc$ is represented by:

$$s_i = p_i + r_i + s_{i-1}$$

The output $s_0$ of the D flip-flop 57 at the initial state (i.e., at the time $t=0$) is equal to 0 ($s_0=0$). Further, the output $r_i$ of the sign invertor 56 is also equal to 0 ($r_i=0$) during the time $t \leq (2n+1)Tc$. The output $s_i$ of the D flip-flop 57 for $1 \leq i \leq 2n+1$ is thus expressed as:

$$s_i = \sum_{m=1}^{i} P_m = \sum_{m=1}^{i} a0_{(m-1)} \quad (1 \leq i \leq 2n + 1)$$

Next, the above equation is proved for arbitrary $1 \leq i \leq 2n+1$ by mathematical induction. First, for $i=1$, the equation holds since:

$$\begin{aligned} s_1 &= p_1 + r_1 + s_0 \\ &= p_1 \\ &= a00 \end{aligned}$$

Next, assume that the equation is true for i=j. Then, the equation is satisfied for i=j+1 because:

$$s_{j+1} = p_{j+1} + r_{j+1} + s_j$$
$$= p_{j+1} + s_j$$
$$= a0_j + \sum_{m=1}^{j} a0_{(m-1)}$$
$$= \sum_{m=1}^{j+1} a0_{(m-1)}$$

Thus, it has been proved that the equation holds for all integer i in the range: $1 \leq i \leq 2n+1$ (QED).

Thus, the output $s_{2n+1}$ of the D flip-flop 57 at the time $t=(2n+1)Tc$ is given by:

$$s_{2n+1} = \sum_{m=1}^{2n+1} a0_{(m-1)}$$

Namely, the value $s_{2n+1}$ is equal to $(2n+1)$ times the average of the preceding $(2n+1)$ output values: a00, a01 ..., $a0_{(2n)}$, of the exclusive OR element 51. From this it can be shown that the following relation holds for $t > (2n+1)Tc$:

$$s_i = \sum_{m=1}^{2n+1} a0_{(m-2n-2+i)} \quad (i \geq 2n+1)$$

Next, the above equation is proved by mathematical induction. First, for $i=2n+1$ the equation holds since:

$$s_{2n+1} = \sum_{m=1}^{2n+1} a0_{(m-1)}$$

Next, assume that the equation holds for i=j. Then the equation is satisfied for i=j+1 since:

$$s_{j+1} = p_{j+1} + r_{j+1} + s_j$$
$$= a0_j - q_{j+1} + s_j$$
$$= a0_j - a0_{(j-2n-1)} + \sum_{m=1}^{2n+1} a0_{(m-2n-2+j)}$$
$$= \sum_{m=2}^{2n+2} a0_{(m-2n-2+j)}$$
$$= \sum_{m=1}^{2n+1} a0_{(m-2n-2+j+1)}$$

Thus, the equation has been proved for all integer i not less than $(2n+1)$: $i \geq (2n+1)$. (QED)

In summary, it has been shown that the output $s_i$ of the D flip-flop 57 is equal to $(2n+1)$ times the average of preceding $(2n+1)$ output values, $a0_{(i-2n-1)}$, $a0_{(i-2n)}$, . . ., $a0_{(i-1)}$, of the exclusive OR element 51. This output $s_i$ of the D flip-flop 57 constitutes the output of the running average generator 2a. Thus, after the time $t=(2n+1)Tc$, the running average generator 52a functions similarly to the running average generator 52 of FIG. 1.

By the way, the number of the signals input to the adder 54a is three, irrespective of the number of the stages of the shift register 53a. In the case of the circuit of FIG. 1, the number of signals input to the adder 54 is equal to the number of stages, $(2n+1)$, of the shift register 53. Since n is greater than one ($n \geq 1$) and hence $(2n+1) \geq 3$, the number of signals input to the adder 54a is not greater than (and generally substantially less than) the number of signals input to the adder 54 in the circuit of FIG. 1. Thus, compared to the embodiment of FIG. 1, the circuit of the embodiment of FIG. 7 is simplified.

The output of the running average generator 52a is supplied to the comparator 55. The comparator 55 compares the output of the running average generator 52a with the constant n. Depending on the value $s_i$ of the output of the running average generator 52a and the constant n, the value $d_i$ of the output signal of the comparator 55 is given as follows:

$$d_i = \begin{array}{l} 0 \ (s_i \leq n) \\ 1 \ (s_i > n) \end{array}$$

Namely, the comparator 55 acts as a hard decision means for converting the output $s_i$ of the running average generator 52a into a 2-level signal which takes either the logical value "0" or "1".

Thus, the signal processing within the frequency converter 50a subsequent to the running average generator 52a is identical to that subsequent to the running average generator 52 in FIG. 1. Further, the running average generator 52a acts in a similar manner as the running average generator 52 of FIG. 1. Thus, as in the case of the embodiment of FIG. 1, the running average generator 52a, consisting of the shift register 53a, the adder 54a, the sign invertor 56, and the D flip-flop 57, and the comparator 55 acting as the hard decision means for converting the output of the running average generator 52a into a 2-level logical signal, function as a low pass filter for removing the high frequency components from the output of the exclusive OR element 51.

Thus, as in the case of the embodiment of FIG. 1, the 2-level quantized received signal output from the limiter amplifier 10 is subjected to the frequency conversion by means of the signal processing within the frequency converter 50a. Namely, if the frequency of the 2-level quantized received signal is represented by $f_1$ Hz and that of the signal for frequency conversion by $f_2$ Hz, then the frequency of the received signal after frequency conversion output from the comparator 55 is $|f_1 - f_2|$ Hz.

The received signal after frequency conversion output from the frequency converter 50a is supplied to the phase comparator 60, which is the same as in FIG. 1. Thus, the phase comparator 60 outputs the relative phase signal representing the phase shift of the received signal after frequency conversion relative to the phase reference signal. The relative phase signal output from the phase comparator 60 is delayed by the delay element 40 by one symbol period of the received signal. At the same time, the relative phase signal is input to the subtractor 41, to which the relative phase signal delayed by one symbol period by the delay element 40 is also input. In response to the outputs of the phase comparator 60 and the delay element 40, the subtractor 41 outputs the phase difference signal which is obtained by subtracting in modulo $2\pi$ the relative phase signal delayed by one symbol period from the relative phase signal output from the phase comparator 60. The phase difference signal output from the subtractor 41 represents the phase transition over one symbol period of the received signal. The decision circuit 42 obtains the demodulated data corresponding to the value of the phase difference signal, on the basis of the predetermined correspondence relationship between the phase difference signal and the demodulated data.

The above description of circuit of FIG. 7 relates to the case where the received signal is modulated in accordance with the differential phase shift keying (DPSK). The principle of the invention can also be applied to MSK or GMSK modulation systems. Further, in the case of the above embodiment of FIG. 7, the constant n serving as the parameter of the frequency converter 50a is equal to 2 (n=2) and hence the shift register 53 has six stages to hold the respective bits. However, the constant n may be any positive integer. For example, it may be that n=6 (namely the shift register 53a may have 14 bits) or n=7 (namely, the shift register 53a may have 16 bits).

Next, a differential detection demodulator using a phase detection circuit is described. A digital differential detection demodulator using a phase detection circuit is disclosed, for example, in H. Tomita et al., "DIGITAL INTERMEDIATE FREQUENCY DEMODULATION TECHNIQUE", Paper B-299, 1990 Fall National Conference of the Institute of Electronics, Information and Communication Engineers of Japan. The differential detection demodulator is described by reference to drawings.

Figure 9:
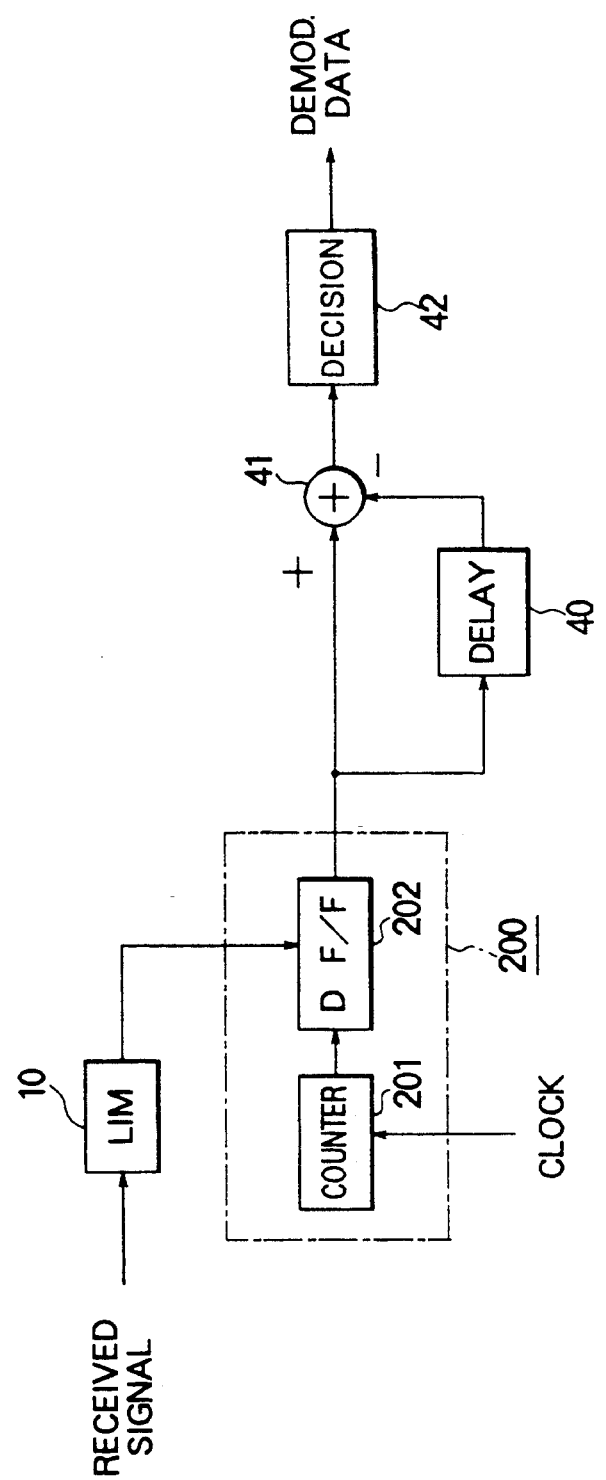
FIG. 9 is a block diagram showing the structure of a conventional digital differential detection demodulator provided with a phase detection circuit.

FIG. 9 is a block diagram showing the structure of a digital differential detection demodulator provided with a phase detection circuit. First, the received signal is supplied to a limiter amplifier 10. The output of the limiter amplifier 10 is coupled to a phase detection circuit 200 including: a counter 201 counting in modulo K, where K is a positive integer; and a D flip-flop array 202. The output of the phase detection circuit 200 is coupled to: a delay element 40 having a delay time equal to the one symbol period of the received signal; and a subtractor 41 effecting subtraction in modulo $2\pi$.

Next the operation of the circuit of FIG. 9 is described. The received signal, which is a differential phase shift keying (DPSK) signal, is shaped by the limiter amplifier 10 into a rectangular waveform of constant amplitude. Namely, the limiter amplifier 10 acts as a quantizer for effecting 2-level quantization upon the received signal. Thus, the received signal is quantized by the limiter amplifier 10 into a 2-level signal taking the value either at the logical "0" or logical "1".

The counter 201 of modulo K within the phase detection circuit 200 is supplied by a clock signal having a frequency practically equal to K times the frequency of the received signal. The output of the counter 201 is supplied to the D flip-flop array 202, which is driven by the 2-level quantized received signal output from the limiter amplifier 10. The output of the phase detection circuit 200 represents the relative phase of the 2-level quantized received signal with respect to a virtual phase reference signal.

Figure 10:
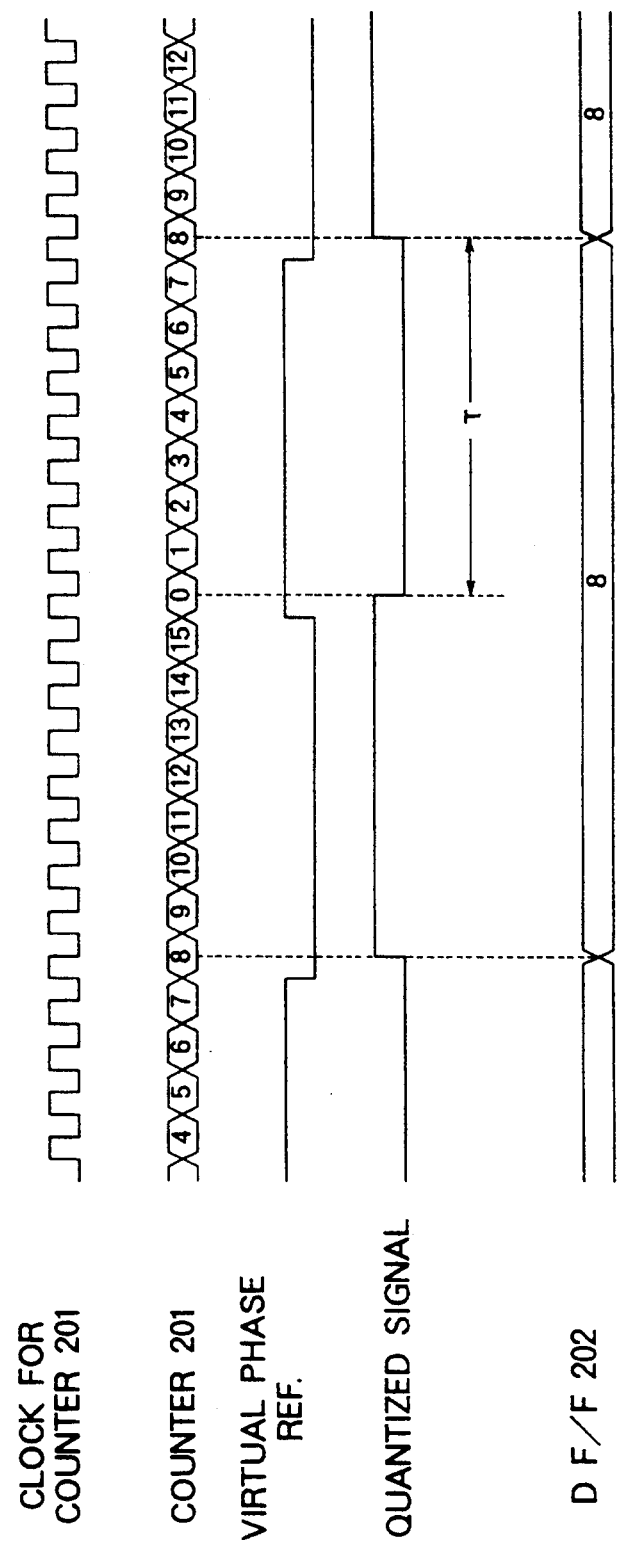
FIG. 10 is a timing chart showing waveforms exemplifying the operation of a phase detection circuit of FIG. 9 in the case where the relative phase of the received signal with respect to the virtual phase reference signal remains constant.
Figure 11:
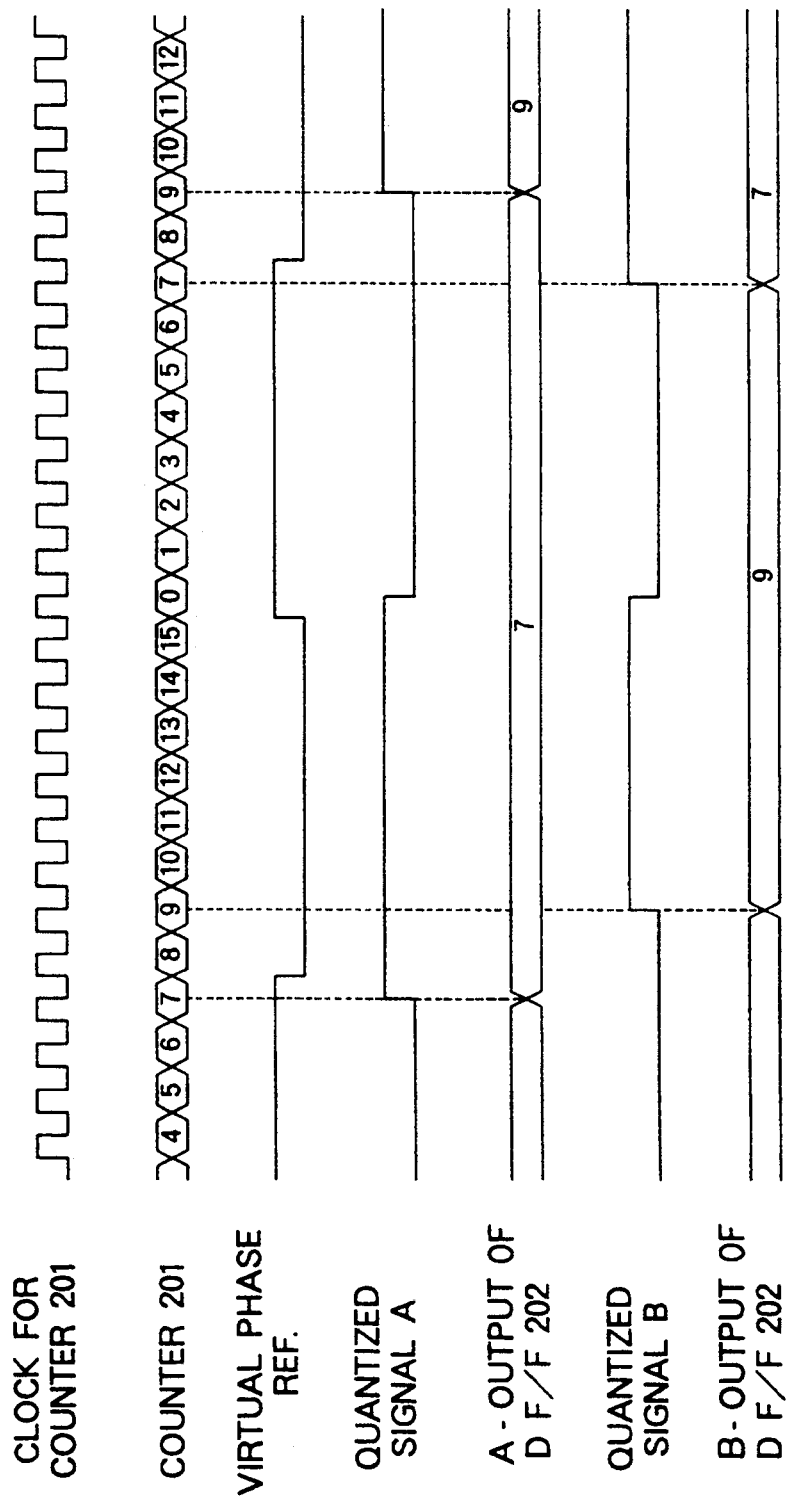
FIG. 11 is a timing chart showing waveforms exemplifying the operation of a phase detection circuit of FIG. 9, in the case where the relative phase of the received signal with respect to the virtual phase reference signal varies.

Next this is described by reference to waveform diagrams. FIGS. 10 and 11 are timing charts showing the waveforms exemplifying the operation of the phase detection circuit 200, where K=16. In FIG. 10 are shown, from top to bottom, the waveforms of: the clock supplied to the counter 201; the output of the counter 201; the virtual phase reference signal, which is obtained by dividing the clock of the counter 201 by K (equal to 16 in this case); the 2-level quantized received signal; and the output of the D flip-flop array 202. From top to bottom in FIG. 11 are shown the waveforms of: the clock for the counter 201; the output of the counter 201; the virtual phase reference signal; the 2-level quantized received signal A, the phase of which is increasingly lagged; output A of D flip-flop array 202 corresponding to the 2-level quantized received signal A; the 2-level quantized received signal B, the phase of which is increasingly led; and the output B of the D flip-flop array 202 corresponding to the 2-level quantized received signal B.

The virtual phase reference signal rises to logical "1" at the instant when the output of the counter 201 is reset to logical "0", and falls to logical "0" at the instant when the output of the counter 201 reaches K/2 (equal to 8 in this case). If the period of the clock of the counter 201 is represented by T and that of the virtual phase reference signal $T_r$, then:

$$T_r = K T$$

Thus, if the length of time between the rising edges of the virtual phase reference signal and the 2-level quantized received signal is represented by $\tau$, then the phase shift $\psi$ of the 2-level quantized received signal relative to the virtual phase reference signal is given by:

$$\psi = 2\pi \tau/T_r = 2\pi \tau/(K T)$$

On the other hand, as seen from FIG. 10, the output of the counter 201 at the rising edge of the 2-level quantized received signal is equal to an integer obtained by dividing the time $\tau$ by the period T of the clock of the counter 201 and then discarding the fractional parts of the quotient.

The D flip-flop array 202 is driven at each rising edge of the 2-level quantized received signal to hold the output of the counter 201. Thus, the output of the D flip-flop array 202 is equal to the integer obtained by dividing the shift time $\tau$ by the period T of the clock of the counter 201 and then discarding the fractional parts of the quotient resulting from the division. Namely, if the output of the D flip-flop array 202 is represented by $\mu$, where $\mu \in \{0, 1, \ldots, K-1\}$, then the following relation holds among $\mu$, T and $\tau$:

$$\mu \leq \tau/T < (\mu+1)$$

Thus, the following relation holds between the phase shift $\psi$ of the 2-level quantized received signal relative to the virtual phase reference signal and the output $\mu$ of the D flip-flop array 202:

$$2\pi\mu/K \leq \psi < 2\pi(\mu+1)/K$$

This relation shows that the output of the D flip-flop array 202 can be regarded as the relative phase of the 2-level quantized received signal with respect to the virtual phase reference signal.

FIG. 10 shows the case where the relative phase of the 2-level quantized received signal with respect to the virtual phase reference signal is constant. Thus, the output of the D flip-flop array 202 remains at eight (8). On the other hand, FIG. 11 shows the case where the relative phase signal of the 2-level quantized received signal A is increasingly lagged and the relative phase of the 2-level quantized received signal B is increasingly led. Thus, upon receiving the 2-level quantized received signal A, the output A of the D flip-flop array 202 increases from seven (7) to nine (9). On the other hand, upon receiving the 2-level quantized received signal B, the output B of the D flip-flop array 202 decreases from nine (9) to seven (7). In either case, the output of the D flip-flop array 202 varies in proportion to the variation of the relative phase of the 2-level quantized received signal with respect to the virtual phase reference signal.

The operation of the delay element 40, the subtractor 41 and the decision circuit 42 are similar to those of FIG. 1.

The phase detection circuit of FIG. 9 has the following disadvantage. The D flip-flop array 202 is driven only at the rising edges of the 2-level quantized received signal. Thus, the relative phase signal output from the phase detection circuit is updated only at each full period of the 2-level quantized received signal. In principle, however, the value of the relative phase of the 2-level quantized received signal can be updated two times for each period of the 2-level quantized received signal. Namely, the phase detection circuit of FIG. 9 has the disadvantage that the rate at which the relative phase signal is updated is low.

Next, a differential detection demodulator provided with a phase detection circuit which solves this problem of the circuit of FIG. 9 is described.

Figure 12:
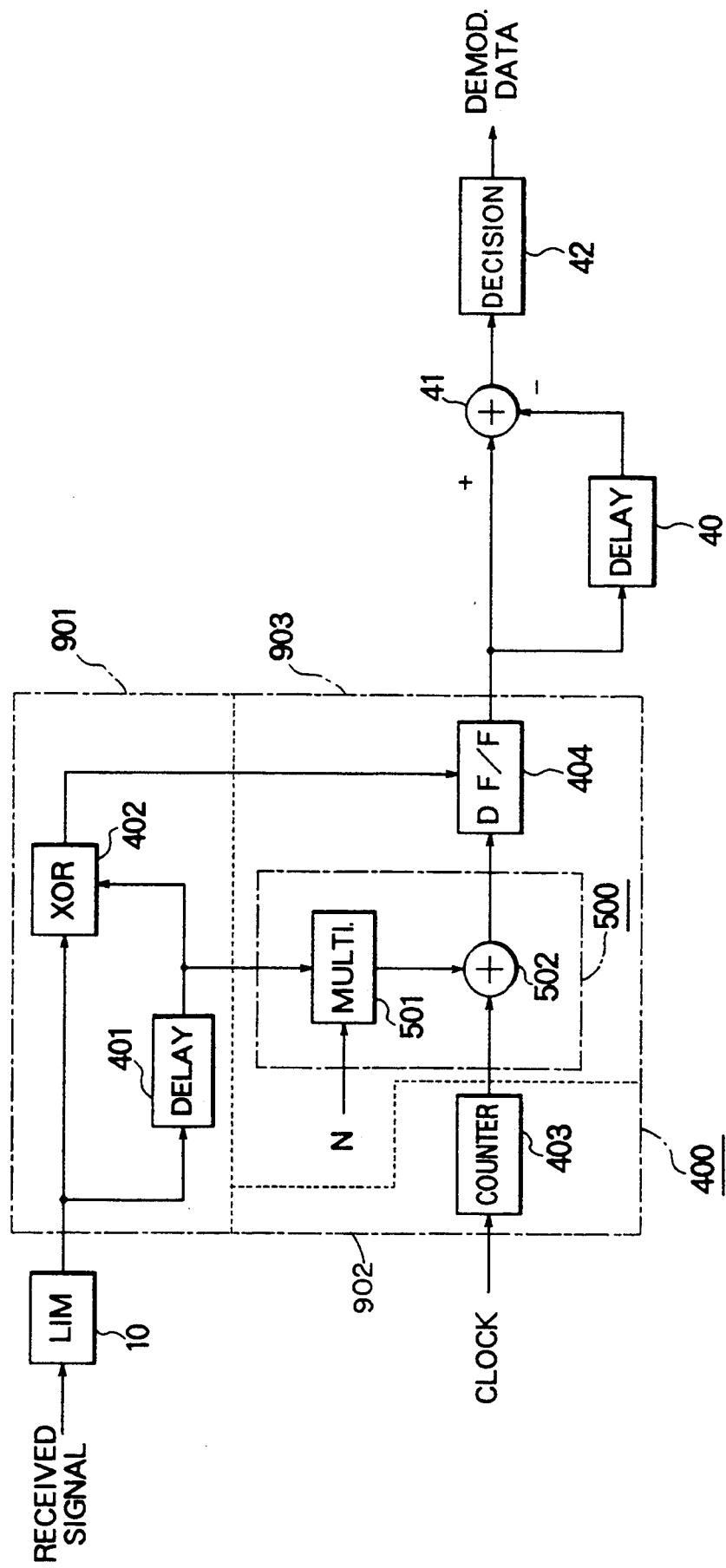
FIG. 12 is a block diagram of a differential detection demodulator provided with a phase detection circuit according to this invention, by which the value of the relative phase of the 2-level quantized received signal with respect to the virtual phase reference signal can be updated two times for each period of the 2-level quantized received signal.

FIG. 12 is a block diagram of a differential detection demodulator provided with a phase detection circuit according to this invention, by which the value of the relative phase of the 2-level quantized received signal with respect to the virtual phase reference signal can be updated two times for each period of the 2-level quantized received signal. The output of limiter amplifier 10 is coupled to a phase detection circuit 400 which includes: a delay element 401 and an exclusive OR element 402 coupled to the limiter amplifier 10; a modulo 2N counter 403 for counting in modulo 2N, where N is a positive integer; a D flip-flop array 404; and a phase inversion corrector 500. The phase inversion corrector 500 includes: a multiplier 501 and an adder 502 for effecting addition in modulo 2N.

Functionally, the phase detection circuit 400 is divided into a half-period detection means 901, a phase reference signal generation means 902 and a phase shift measurement means 903. The half-period detection means 901 consists of the delay element 401 and the exclusive OR element 402. Upon receiving the 2-level quantized received signal from the limiter amplifier 10, the half-period detection means 901 outputs a half-period detection signal at each half-period of the received signal. The phase reference signal generation means 902 consists of the modulo 2N counter 403. On the basis of a clock signal having a frequency not less than twice the frequency of the two-level quantized received signal, the phase reference signal generation means 902 generates the phase reference signal serving as the reference for measuring the phase shift of the 2-level quantized received signal. A phase shift measurement means 903 consists of the D flip-flop array 404 and the phase inversion corrector 500. The phase inversion corrector 500 corrects the phase inversion of the phase reference signal at each half-period of the received signal. On the basis of the corrected phase reference signal and the half-period detection signal output from the half-period detection means 901, the phase shift measurement means 903 determines and outputs the phase shift of the 2-level quantized received signal relative to the phase reference signal at each half-period of the received signal.

The delay element 40, subtractor 41, and the decision circuit 42 are similar to those described in FIG. 9.

Next, the operation of the circuit of FIG. 12 is described in detail. In FIG. 12, the limiter amplifier 10 shapes the received signal into a rectangular waveform of a constant amplitude. Namely, the limiter amplifier 10 acts as a 2-level quantizer for subjecting the received signal to the 2-level quantization, such that the output of the limiter amplifier 10 is quantized to logical "0" and "1".

The 2-level quantized received signal output from the limiter amplifier 10 is supplied to the phase detection circuit 400, where it is first input to the delay element 401 and the exclusive OR element 402. The delay time of the delay element 401 is shorter than the half-period of the 2-level quantized received signal. The delayed received signal output from the delay element 401 is supplied to the exclusive OR element 402, together with the 2-level quantized received signal output from the limiter amplifier 10. The exclusive OR element 402 effects the logical exclusive OR operation upon the outputs of the limiter amplifier 10 and the delay element 401. Thus, the output of the exclusive OR element 402 is a pulse signal (referred to as the differential pulse signal) which rises (i.e., has rising edges) at the rising and the falling edges of the 2-level quantized received signal. Next, this is described by reference to drawings.

Figure 13:
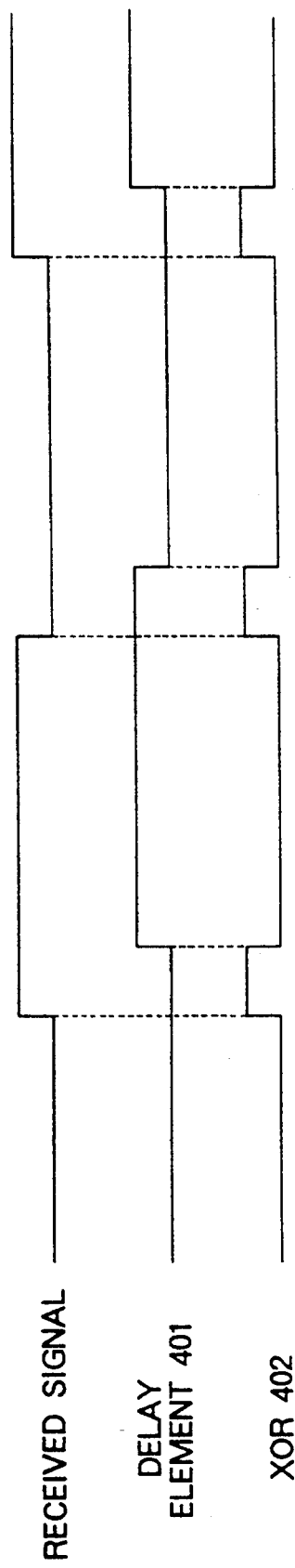
FIG. 13 is a timing chart showing waveforms exemplifying the operation of the delay element 401 and the exclusive OR element 402 of FIG. 12.

FIG. 13 is a timing chart showing waveforms exemplifying the operation of the delay element 401 and the exclusive OR element 402 of FIG. 12. From top to bottom in FIG. 13 are shown the waveforms of: the 2-level quantized received signal; the output of the delay element 401; and the output of the exclusive OR element 402 (the differential pulse signal). As shown in FIG. 13, the delay time of the delay element 401, namely the time length by which the 2-level quantized received signal is delayed, is shorter than the half-period of the 2-level quantized received signal. Thus, the differential pulse signal output from the exclusive OR element 402 rises (i.e., has the rising edges) at the rising and the falling edges of the 2-level quantized received signal.

On the other hand, the modulo 2N counter 403 is driven by a clock signal having a frequency practically equal to 2N times the frequency of the 2-level quantized received signal. If a virtual phase reference signal similar to that of FIG. 9 is assumed which is obtained by dividing the clock signal of the modulo 2N counter 403 by 2N, the virtual phase reference signal rises (i.e., has the rising edge) at the instant when the output of the modulo 2N counter 403 is reset to "0", and falls (i.e., has the falling edge) at the instant when the output of the modulo 2N counter 403 reaches N. The output of the modulo 2N counter 403 represents the phase of this virtual phase reference signal. Namely, if the output of the modulo 2N counter 403 at the time when the phase of the virtual phase reference signal is $\theta$ is represented by $a(a \in \{0, 1, \ldots, 2n-1\})$, then the following relation holds between $\theta$ and $a$:

$$\pi a/N \leq \theta < \pi(a+1)/N$$

Thus, the output of the modulo 2N counter 403 at each rising edge of the differential pulse signal output from the exclusive OR element 402 represents the phase of the virtual phase reference signal at the rising or the falling edge of the 2-level quantized received signal. By the way, the output of the modulo 2N counter 403 at the falling edge of the virtual phase reference signal is equal to "N". Thus, if the output of the modulo 2N counter 403 at the falling edge of the 2-level quantized received signal is corrected by numerical value "N" corresponding to the phase $\pi$, then the relative phase of the 2-level quantized received signal with respect to the virtual phase reference signal at the falling edge of the 2-level quantized received signal can be obtained. Next, this is described by reference to drawings.

Figure 14:
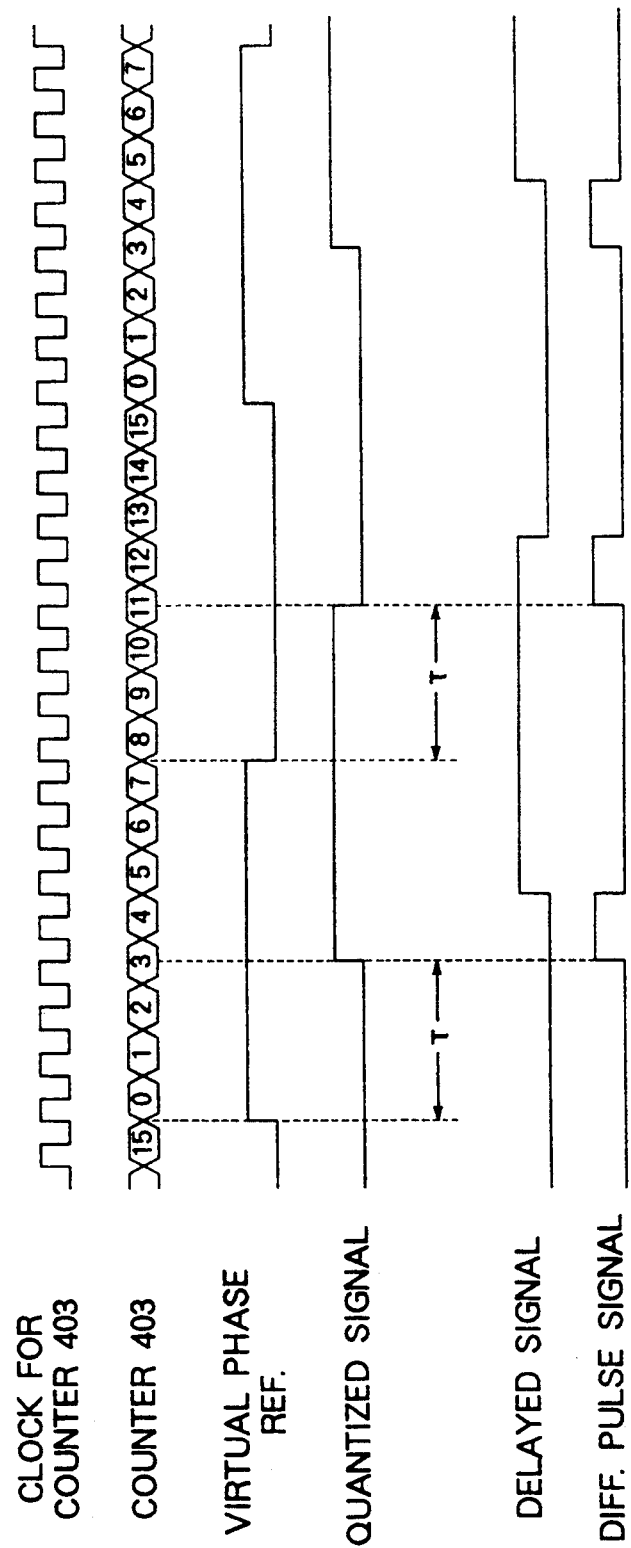
FIG. 14 is a timing chart exemplifying the waveforms of the output of the modulo 2N counter 403, the virtual phase reference signal, the 2-level quantized received signal, and the differential pulse signal of FIG. 12, in the case where N=8.

FIG. 14 is a timing chart exemplifying the waveforms of the output of the modulo 2N counter 403, the virtual phase reference signal, the 2-level quantized received signal, and the differential pulse signal of FIG. 12, in the case where N=8. From top to bottom are shown the waveforms of: the clock signal for the modulo 2N counter 403; the output of the modulo 2N counter 403; the virtual phase reference signal; the 2-level quantized received signal; the delayed received signal (output of the delay element 401); and the differential pulse signal (output of the exclusive OR element 402). The modulo 2N counter 403 counts the clock signal in modulo 2N=16.

Let the periods of the clock signal of the modulo 2N counter 403 and the virtual phase reference signal be represented by T and $T_r$, respectively. Then:

$$T_r = 2N \cdot T$$

Thus, if the time length between the rising or the falling edges of the virtual phase reference signal and the 2-level quantized received signal is represented by T, the phase shift $\psi$ of the 2-level quantized received signal relative to the virtual phase reference signal is given by:

$$\psi = 2\pi\tau/T_r = \pi\tau/(N \cdot T)$$

Further, let the output of the modulo 2N counter 403 at a rising edge of the 2-level quantized received signal be represented by $\beta_1$, where $\beta_1 \in \{0, 1, \ldots, 2N-1\}$. Then $\beta_1$ is equal to an integer obtained by first normalizing (i.e., dividing) the time $\tau$, between the rising edges of the virtual phase reference signal and the 2-level quantized received signal, by the period T of the modulo 2N counter 403 and then discarding the fractional part of the quotient resulting from the division. Namely, the following relation holds among $\beta_1$, T and $\tau$:

$$\beta_1 \leq \tau/T < (\beta_1 + 1)$$

On the other hand, the output of the modulo 2N counter 403 at the falling edge of the virtual phase reference signal is equal to "N" (=8 in the case of FIG. 14) corresponding to the phase $\pi$. Let the output of the modulo 2N counter 403 at a falling edge of the 2-level quantized received signal be represented by $\beta_2$, where $\beta_2 \in \{0, 1, \ldots, 2N-1\}$. Then $\beta_2$ is equal to an integer obtained by: first normalizing (i.e., dividing) the time $\tau$ between the falling edges of the virtual phase reference signal and the 2-level quantized received signal by the period T of the modulo 2N counter 403; then discarding the fractional part of the quotient resulting from the division; and finally adding numerical value "N" to the quotient. Thus, the following relation holds among $\beta_2$, T and $\tau$:

$$(\beta_2 - N) \leq \tau/T < (\beta_2 - N + 1)$$

The subtraction in the above equation is in modulo 2N. Subtracting "N" in modulo 2N, however, is equivalent to adding "N" in modulo 2N. Thus the above equation is equivalent to:

$$(\beta_2 + N) \leq \tau/T < (\beta_2 + N + 1)$$

From the above discussion, it has been shown that the following relations hold among the output of the modulo 2N counter 403, $\beta_1$ and $\beta_2$, and the phase shift $\psi$ of the 2-level quantized received signal:

$$\pi\beta_1/N \leq \psi < \pi(\beta_1 + 1)/N$$

$$\pi(\beta_2/N)/N \leq \psi < (\beta_2 + N + 1)/N$$

These relations show that the output $\beta_1$ of the modulo 2N counter 403 at the rising edge of the 2-level quantized received signal and the value obtained by adding numerical value "N" in modulo 2N to the output $\beta_2$ of the modulo 2N counter 403 at the falling edge of the 2-level quantized received signal can be regarded as representing the relative phase of the 2-level quantized received signal with respect to the virtual phase reference signal. In other words, the relative phase of the 2-level quantized received signal can be obtained by correcting the output of the modulo 2N counter 403, i.e., by adding the numerical value "0" at the rising edge, and the numerical value "N" at the falling edge, of the 2-level quantized received signal.

The phase inversion corrector 500 effects this correction for the output of the modulo 2N counter 403. Namely, upon receiving the output of the modulo 2N counter 403, the phase inversion corrector 500 adds to it the numerical value "0" at the rising edge, and the numerical value "N" at the falling edge, of the 2-level quantized received signal. Next, the operation of the phase inversion corrector 500 is described by reference to drawings.

Figure 15:
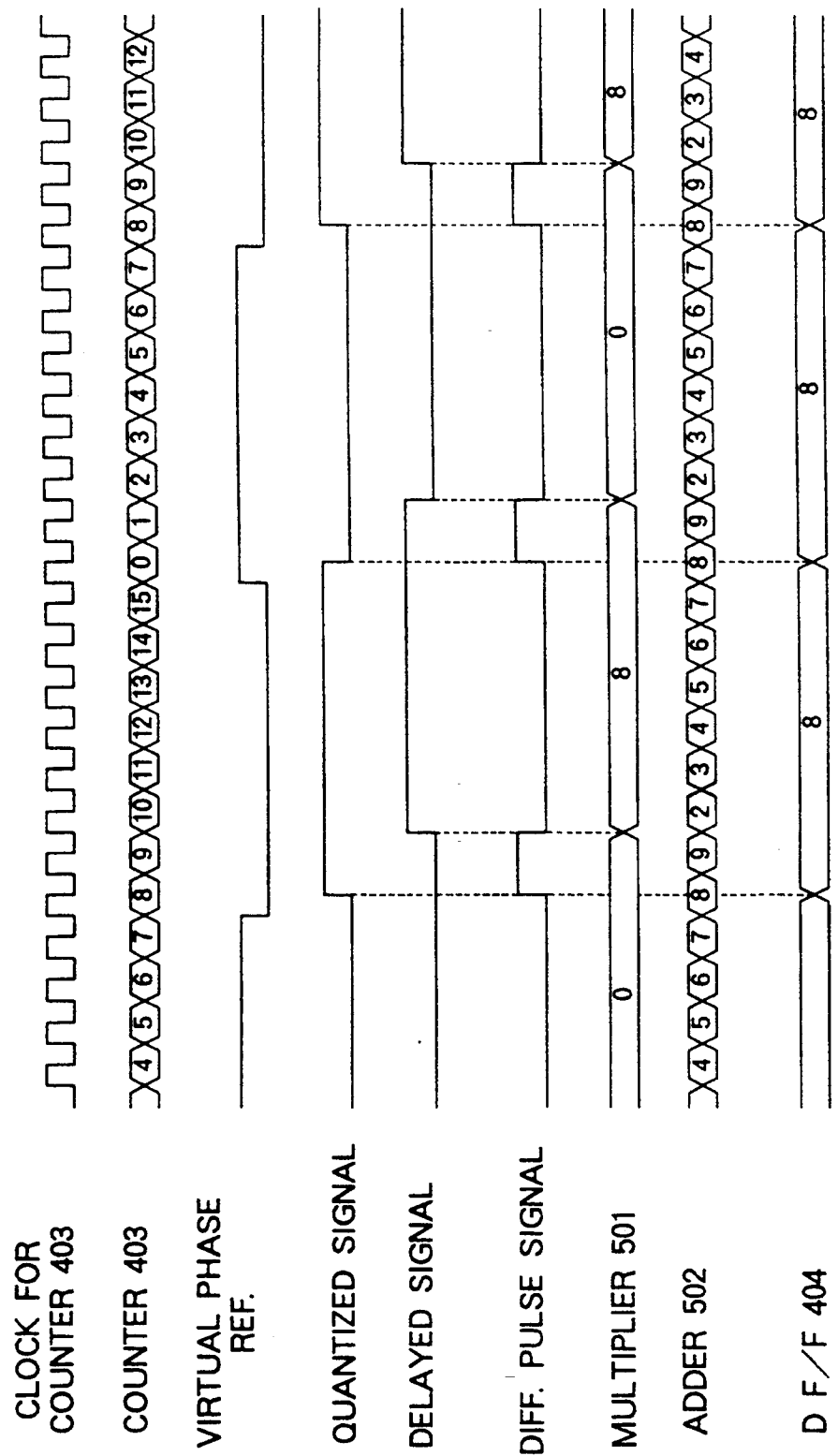
FIG. 15 is a timing chart showing the waveforms exemplifying the operation of the phase detection circuit 400 of FIG. 12, where N=8 (2N=16) and where the relative phase of the 2-level quantized received signal with respect to the virtual phase reference signal remains constant.
Figure 16:
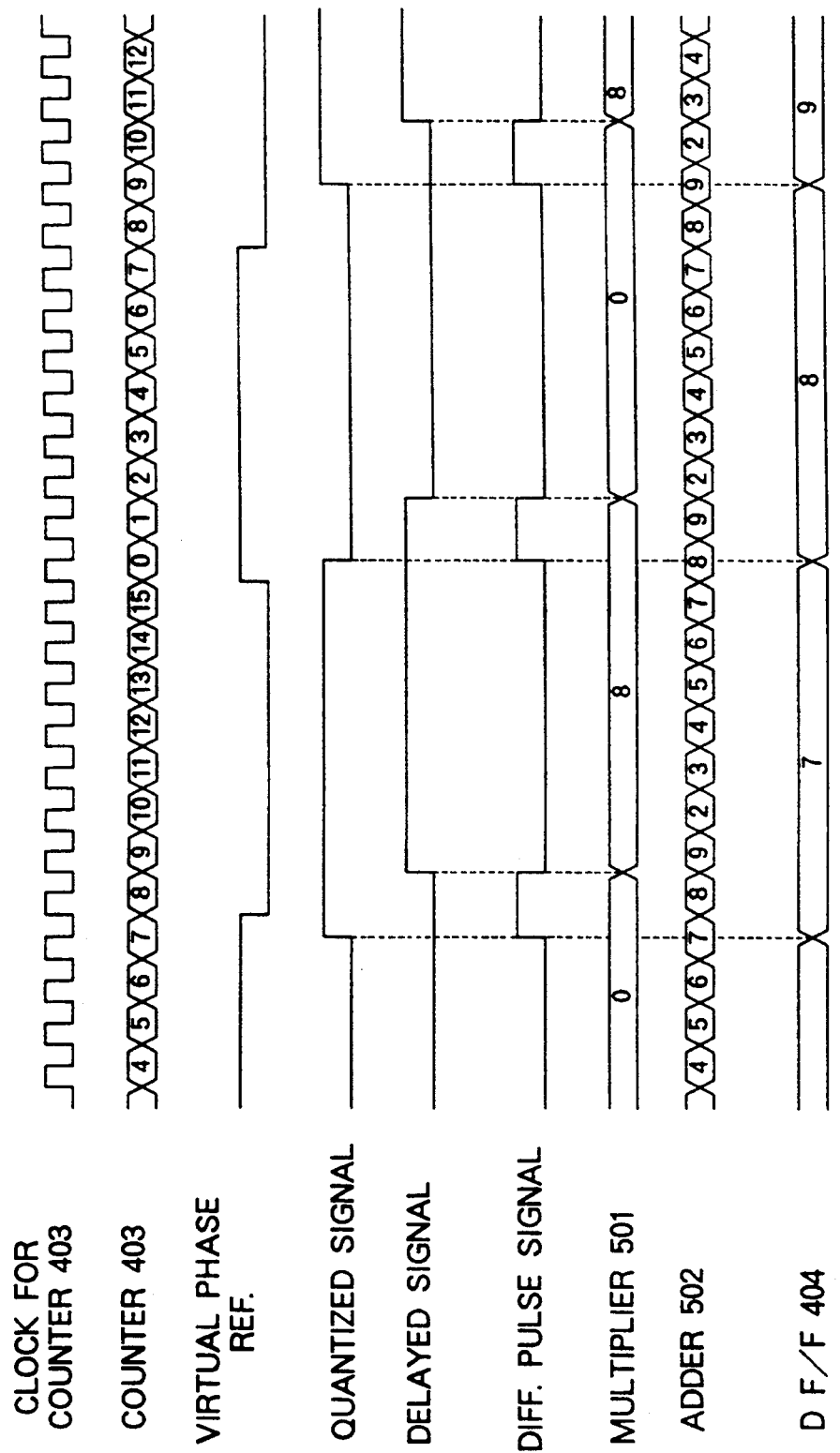
FIG. 16 is a view similar to that of FIG. 15, but showing the case where the relative phase of the 2-level quantized received signal with respect to the virtual phase reference signal is increasingly lagged.
Figure 17:
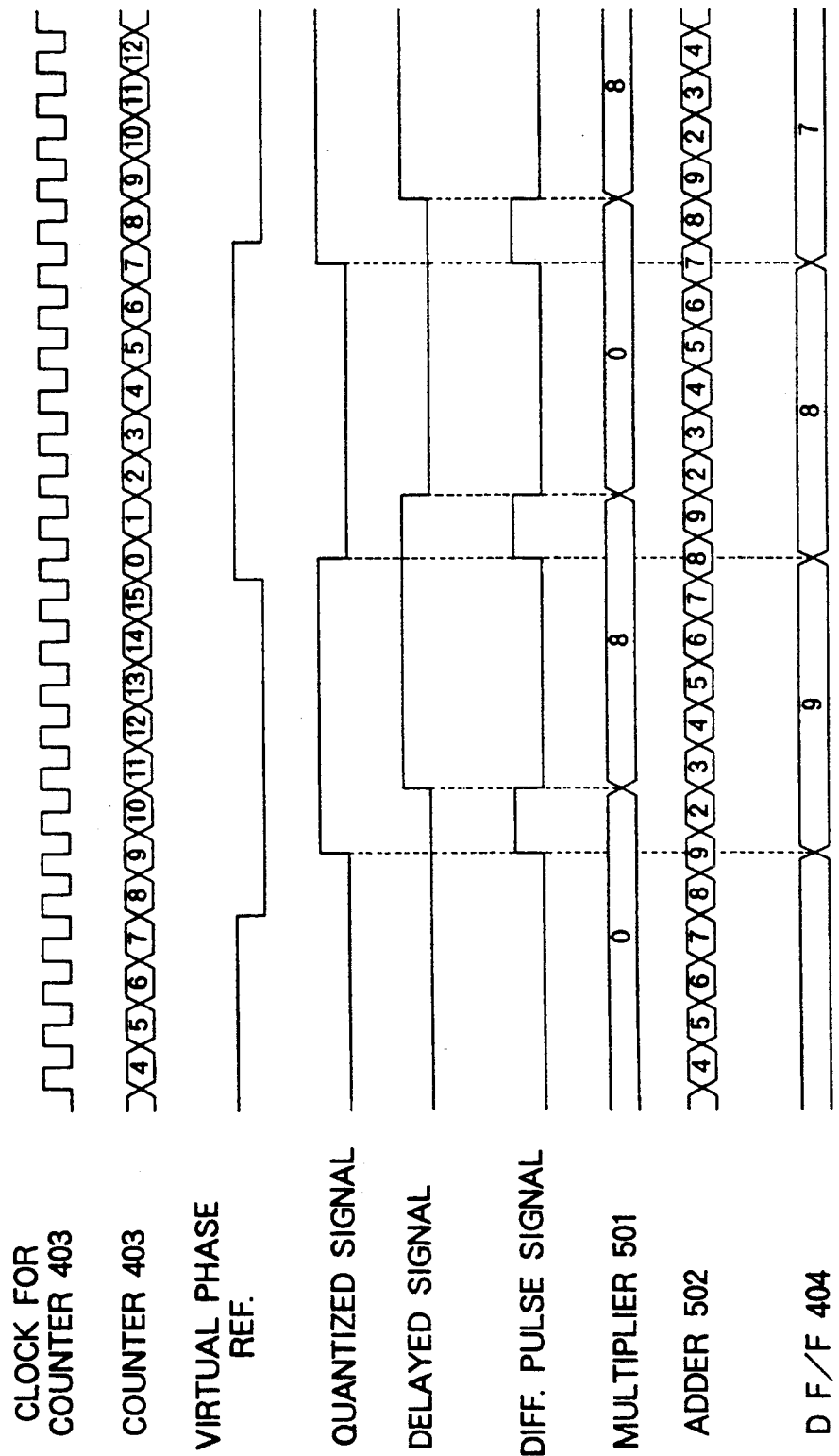
FIG. 17 is a view similar to that of FIG. 15, but showing the case where the relative phase of the two-value quantized received signal with respect to the virtual phase reference signal is increasingly led.

FIG. 15 is a timing chart showing the waveforms exemplifying the operation of the phase detection circuit 400 of FIG. 12, where N=8 (2N=16) and where the relative phase of the 2-level quantized received signal with respect to the virtual phase reference signal remains constant. FIG. 16 is a view similar to that of FIG. 15, but showing the case where the relative phase of the 2-level quantized received signal with respect to the virtual phase reference signal is increasingly lagged. FIG. 17 is a view similar to that of FIG. 15, but showing the case where the relative phase of the 2-level quantized received signal with respect to the virtual phase reference signal is increasingly led. From top to bottom in the figures are shown the waveforms of: the clock signal for the modulo 2N counter 403; the output of the modulo 2N counter 403; the virtual phase reference signal; the 2-level quantized received signal; the delayed received signal (output of the delay element 401); the differential pulse signal (output of the exclusive OR element 402); the output of the multiplier 501; the output of the adder 502; and the output of the D flip-flop array 404.

As shown in these figures, the value of the delayed received signal output from the delay element 401 is at logical "0" at the rising edge, and at logical "1" at the falling edge, of the 2-level quantized received signal. The multiplier 501 multiplies output of the delay element 401 by N, thereby outputting the numerical value "0" at the rising edge, and the numerical value "N" at the falling edge, of the 2-level quantized received signal. The adder 502 adds in modulo 2N the outputs of the modulo 2N counter 403 and the multiplier 501, thereby obtaining the output of the phase inversion corrector 500. The output of the phase inversion corrector 500 is equal to the output of the modulo 2N counter 403 at the rising edge of the 2-level quantized received signal. The output of the phase inversion corrector 500 is equal to the value obtained by adding in modulo 2N the numerical value "N" to the output of the modulo 2N counter 403, at the falling edge of the 2-level quantized received signal.

The output of the phase inversion corrector 500 is supplied to the D flip-flop array 404, which is driven by the differential pulse signal output from the exclusive OR element 402. As described above, the differential pulse signal has rising edges at the rising and falling edges of the 2-level quantized received signal. Thus, the D flip-flop array 404 is driven at each rising and falling edge of the 2-level quantized received signal. Thus, if the output of the D flip-flop array 404 is represented by $\mu$, then $\mu$ is expressed in terms of the output values $\beta_1$ and $\beta_2$ of the modulo 2N counter 403 at the rising and the falling edges, respectively:

$$\mu = \beta_1$$

$$\mu = \beta_2 + N$$

Thus, the following relation holds between the phase shift $\psi$ of the 2-level quantized received signal with respect to the virtual phase reference signal and the output $\mu$ of the D flip-flop array 404:

$$\pi\mu/N \leq \psi < \pi(\mu+1)/$$

This relation shows that the output $\mu$ of the D flip-flop array 404 can be regarded as representing the relative phase of the 2-level quantized received signal with respect to the virtual phase reference signal. This can be easily understood by reference to FIGS. 15 through 17.

It is noted that in the case of the circuit of FIG. 9, the output of the D flip-flop array 202 representing the relative phase of the 2-level quantized received signal is updated only once for each period of the 2-level quantized received signal. In the case of the circuit of FIG. 12, however, the D flip-flop array 404 is driven by the differential pulse signal at the rising and the falling edges of the 2-level quantized received signal. Thus, the output of the D flip-flop array 404 representing the relative phase of the 2-level quantized received signal is updated twice for each period of the 2-level quantized received signal. The updating rate of the relative phase signal is thereby doubled. This can be easily comprehended by comparing FIG. 15 with FIG. 10 and FIGS. 16 and 17 with FIG. 11.

Namely, the 2-level quantized received signal A of FIG. 11 and the 2-level quantized received signal of FIG. 16 are the same. The output A of the D flip-flop array 202 in FIG. 11 varies from "7" to "9", while the output of the D flip-flop array 404 in FIG. 16 varies gradually from "7" to "8" to "9". Similarly, the 2-level quantized received signal B of FIG. 11 and the 2-level quantized received signal of FIG. 17 are the same. The output B of the D flip-flop array 202 in FIG. 11 varies from "9" to "7", while the output of the D flip-flop array 404 in FIG. 17 varies gradually from "9" to "8" to "7". The updating rate of the relative phase signal is doubled for the circuit of FIG. 12, and hence the variation of the value of the relative phase signal is rendered less abrupt.

The operations of the delay element 40, the subtractor 41, and the decision circuit 42 are similar to those of the corresponding parts described in FIG. 9.

In FIG. 12, the phase inversion corrector 500 consists of the multiplier 501 and the adder 502. However, the element corresponding to the multiplier 501 may be implemented by any circuit which outputs numerical value "0" upon receiving numerical value "0", and numerical value "N" upon receiving numerical value "1". Such element may be implemented by a data selector which selects and outputs numerical value "0" upon receiving numerical value "0", and numerical value "N" upon receiving numerical value "1". Alternatively, the phase inversion corrector 500 may consist of logical product elements (AND gates) for effecting logical product operations (AND operations) upon the respective bits of the numerical value "N" and the output of the delay element 401.

The above description relates to the case where the received signal is modulated in accordance with the differential phase shift keying (DPSK). This invention, however, can also be applied to MSK or GMSK modulation systems. Further, in the case of the above embodiment, the constant N serving as the operation parameter of the phase detection circuit 400 is equal to 8 (N=8). However, the constant N may be any positive integer. For example, N may be N=16 or N=32.

Figure 18:
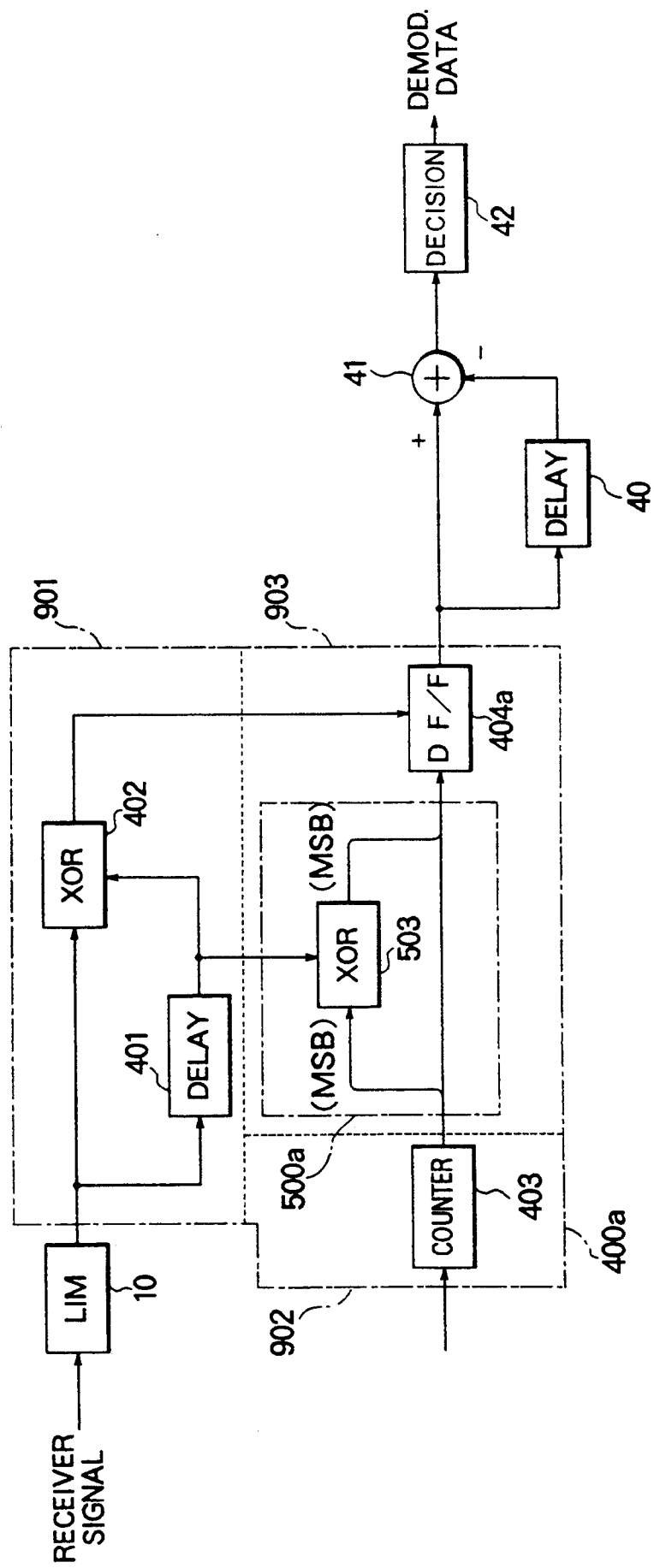
FIG. 18 is a block diagram of another differential detection demodulator provided with a phase detection circuit according to this invention, by which the value of the relative phase of the 2-level quantized received signal with respect to the virtual phase reference signal can be updated two times for each period of the 2-level quantized received signal.

FIG. 18 is a block diagram of another differential detection demodulator provided with a phase detection circuit according to this invention, by which the value of the relative phase of the 2-level quantized received signal with respect to the virtual phase reference signal can be updated two times for each period of the 2-level quantized received signal. In FIG. 18, the phase detection circuit 400a is functionally divided into: a half-period detection means 901 consisting of the delay element 401 and the exclusive OR element 402; a phase reference signal generation means 902 consisting of the modulo $2^M$ counter 403a, where M is a positive integer; and a phase shift measurement means 903 consisting of the D flip-flop array 404a and a phase inversion corrector 500a. The phase inversion corrector 500a consists of an exclusive OR element 503 having inputs coupled to the output of the delay element 401 and the most significant bit (MSB) of the output of the modulo $2^M$ counter 403a. The combination of the least significant bits (namely the first through (M−1)th bit of the modulo $2^M$ counter 403a) and the output of the exclusive OR element 503 is input to the D flip-flop array 404a. Otherwise the circuit of FIG. 18 is similar to the circuit of FIG. 12.

Next, the operation of the circuit of FIG. 18 is described in detail. In FIG. 18, the limiter amplifier 10 shapes the received signal into a rectangular waveform of a constant amplitude. Namely, the limiter amplifier 10 acts as a 2-level quantizer for subjecting the received signal to the 2-level quantization, such that the output of the limiter amplifier 10 is quantized to logical "0" and "1".

The 2-level quantized received signal output from the limiter amplifier 10 is supplied to the phase detection circuit 400a, where it is first input to the delay element 401 and the exclusive OR element 402. The delay time of the delay element 401 is shorter than the half-period of the 2-level quantized received signal. The delayed received signal output from the delay element 401 is supplied to the exclusive OR element 402. The exclusive OR element 402 effects the logical exclusive OR operation upon the outputs of the limiter amplifier 10 and the delay element 401. Thus, the output of the exclusive OR element 402 is a pulse signal (referred to as the differential pulse signal) which rises (i.e., has rising edges) at the rising and the falling edges of the 2-level quantized received signal.

The modulo $2^M$ counter 403a is driven by a clock signal having a frequency practically equal to $2^M$ times the frequency of the 2-level quantized received signal, where M is a positive integer. If a virtual phase reference signal similar to that of FIG. 9 is assumed which is obtained by dividing the clock signal of the modulo $2^M$ counter 403a by $2^M$ the virtual phase reference signal rises (i.e., has the rising edge) at the instant when the output of the modulo $2^M$ counter 403a is reset to "0", and falls (i.e., has the falling edge) at the instant when the output of the modulo $2^M$ counter 403a reaches $2^{M-1}$. The output of the modulo $2^M$ counter 403a represents the phase of this virtual phase reference signal. Namely, if the output of the modulo $2^M$ counter 403a at the time when the phase of the virtual phase reference signal is $\theta$ is represented by $\alpha(\alpha\epsilon\{0, 1, \ldots, 2^M-1\})$, then the following relation holds between $\theta$ and $\alpha$:

$$2\pi\alpha/2^M \leq \theta < 2\pi(\alpha+1)/2^M$$

Thus, the output of the modulo $2^M$ counter 403a at each rising edge of the differential pulse signal output from the exclusive OR element 402 represents the phase of the virtual phase reference signal at the rising or the falling edge of the 2-level quantized received signal. By the way, the output of modulo $2^4$ 403a counter at the falling edge of the virtual phase reference signal is equal to "$2^{M-1}$". Thus, if the output of the modulo $2^M$ counter 403a at the falling edge of the 2-level quantized received signal is corrected by numerical value "$2^{M-1}$" corresponding to the phase $\pi$, then the relative phase of the 2-level quantized received signal with respect to the virtual phase reference signal at the falling edge of the 2-level quantized received signal can be obtained.

The phase inversion corrector 500a effects this correction for the output of the modulo $2^M$ counter 403a. Namely, upon receiving the output of the modulo $2^M$ counter 403a, the phase inversion corrector 500a adds to it the numerical value "0" at the rising edge, and the numerical value "$2^{M-1}$" at the falling edge, of the 2-level quantized received signal. Next, the operation of the phase inversion corrector 500a is described by reference to drawings.

Figure 19:
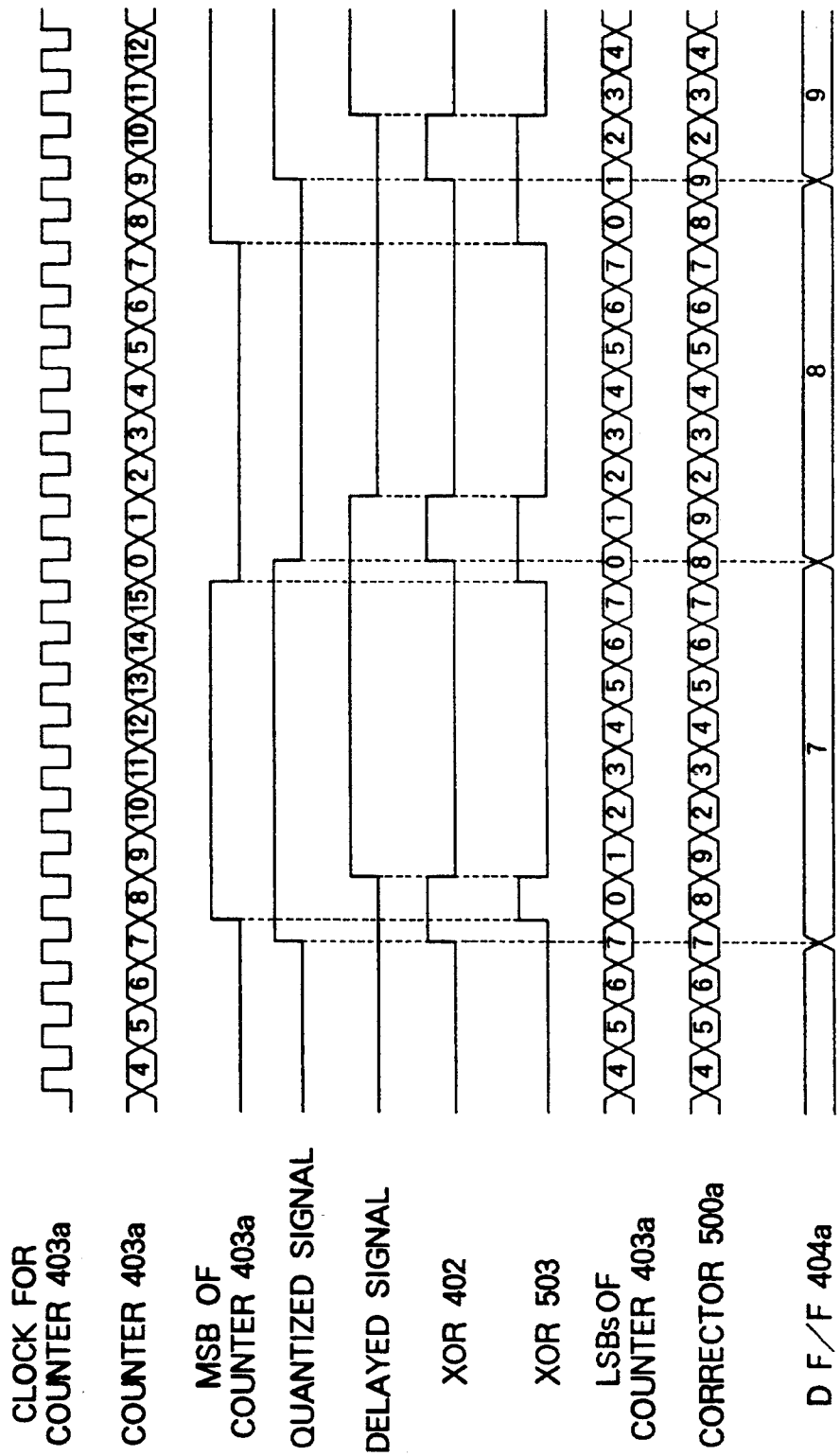
FIG. 19 is a timing chart showing the waveforms exemplifying the operation of the phase detection circuit 400a of FIG. 18, where M=4 ($2^M$=16) and where the relative phase of the 2-level quantized received signal with respect to the virtual phase reference signal remains constant.
Figure 20:
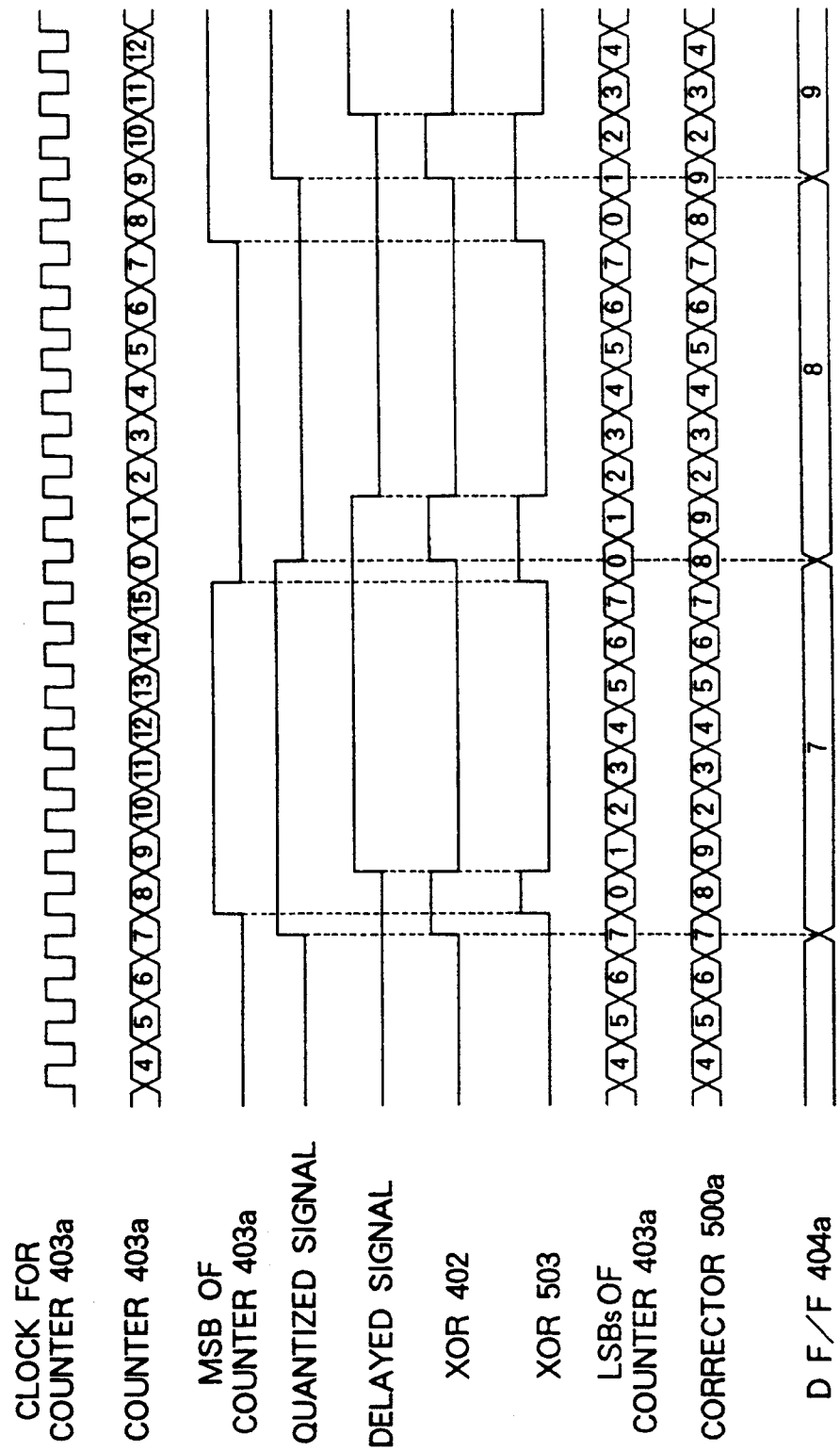
FIG. 20 is a view similar to that of FIG. 19, but showing the case where the relative phase of the 2-level quantized received signal with respect to the virtual phase reference signal is increasingly lagged.

FIG. 19 is a timing chart showing the waveforms exemplifying the operation of the phase detection circuit 400a of FIG. 18, where M=4 ($2^M$=16) and where the relative phase of the 2-level quantized received signal with respect to the virtual phase reference signal remains constant. FIG. 20 is a view similar to that of FIG. 19, but showing the case where the relative phase of the 2-level quantized received signal with respect to the virtual phase reference signal is increasingly lagged. FIG. 21 is a view similar to that of FIG. 19, but showing the case where the relative phase of the 2-level quantized received signal with respect to the virtual phase reference signal is increasingly led. From top to bottom in the respective figures are shown the waveforms of: the clock signal for the modulo $2^M$ counter 403a; the output of the modulo $2^M$ counter 403a; the MSB or the most significant bit (the Mth bit) of the modulo $2^M$ counter 403a (inversion of the virtual phase reference signal); the 2-level quantized received signal; the delayed received signal (output of the delay element 401); the differential pulse signal (output of the exclusive OR element 402); the output of the exclusive OR element 503; the LSBs or the least significant bits (the first through (M−1)th bits) of the modulo $2^M$ counter 403a; the output of the phase inversion corrector 500a (the combination of the least significant bits of the modulo $2^M$ counter 403a and the output of the exclusive OR element 503); and the output of the D flip-flop array 404a. The numbers at the waveforms of the modulo $2^M$ counter 403a, the least significant bits of the 403a, the phase inversion corrector 500a, and the D flip-flop array 404a represent the values thereof at respective instants.

The output of the modulo $2^M$ counter 403a consists of M bits. The most significant bit of the modulo $2^M$ counter 403a represents the numerical value "$2^{M-1}$". Thus, adding the numerical value "$2^{M-1}$" to the output of the modulo $2^M$ counter 403a in modulo $2^M$ is equivalent to logical inversion of the most significant bit of the modulo $2^M$ counter 403a. Thus, adding numerical value "0" and "$2^{M-1}$" respectively, to the output of the modulo $2^M$ counter 403a at the rising and the falling edges of the 2-level quantized received signal results in effecting no logical inversion at the rising edge, and the logical inversion at the falling edge, of the 2-level quantized received signal, upon the most significant bit of the modulo $2^M$ counter 403a.

As shown in FIGS. 19 through 21, the value of the delayed received signal output from the delay element 401 is at logical "0" at the rising edge, and at logical "1" at the falling edge, of the 2-level quantized received signal. The exclusive OR element 503 effects the logical exclusive OR operation upon the delayed received signal output from the delay element 401 and the most significant bit of the output from the modulo $2^M$ counter 403a. The output of the 503 is combined as the new most significant bit with the least significant bits (the first through (M−1)th bits) of the modulo $2^M$ counter 403a, to form the output of the phase inversion corrector 500a. Thus, the output of the phase inversion corrector 500a is equal to the output of the modulo $2^M$ counter 403a at the rising edges of the 2-level quantized received signal (no logical inversion of the most significant bit is effected). On the other hand, the output of the phase inversion corrector 500a at the falling edges of the 2-level quantized received signal consists of the logically inverted most significant bit of the modulo $2^M$ counter 403a combined with the least significant bits thereof. Thus, the output of the phase inversion corrector 500a is equal to the value obtained by adding numerical value "0" at the rising edge, and numerical value "$2^{M-1}$" at the falling edge, of the 2-level quantized received signal, to the output of the modulo $2^M$ counter 403a.

By limiting the constant 2N serving as the operation parameter in the circuit of FIG. 12 to the integer which can be expressed in the form $2^M$, the phase inversion corrector 500a can be implemented only by the exclusive OR element 503. Thus, the circuit of FIG. 18 is simplified compared to the circuit of FIG. 12.

The output of the phase inversion corrector 500a is supplied to the D flip-flop array 404a, which is driven by the differential pulse signal output from the exclusive OR element 402. As described above, the differential pulse signal has rising edges at the rising and falling edges of the 2-level quantized received signal. Thus, the D flip-flop array 404a is driven at each rising and falling edge of the 2-level quantized received signal. Thus, if the output of the D flip-flop array 404a is represented by $\mu$, where $\mu \in \{0,1,\ldots,2^M-1\}$, then $\mu$ is expressed in terms of the output values $\beta_1$ and $\beta_2$ ($\beta_1, \beta_2 \in \{0, 1, \ldots, 2^M-1\}$) of the modulo $2^M$ counter 403a at the rising and the falling edges, respectively:

$$\mu = \beta_1$$

$$\mu = \beta_2 + 2^{M-1}$$

Thus, the following relation holds between the phase shift $\psi$ of the 2-level quantized received signal with respect to the virtual phase reference signal and the output $\mu$ of the D flip-flop array 404a:

$$2\pi\mu/2^M \leq \psi < 2\pi(\mu+1)/2^M$$

This relation shows that the output $\mu$ of the D flip-flop array 404a can be regarded as representing the relative phase of the 2-level quantized received signal with respect to the virtual phase reference signal. This can be easily understood by reference to FIGS. 19 through 21.

As in the case of the circuit of FIG. 12, the D flip-flop array 404a of FIG. 18 is driven by the differential pulse signal at the rising and the falling edges of the 2-level quantized received signal. Thus, the output of the D flip-flop array 404a representing the relative phase of the 2-level quantized received signal is updated twice for each period of the 2-level quantized received signal. The updating rate of the relative phase signal is thereby doubled compared to the case of FIG. 9. This can be easily comprehended by comparing FIG. 19 with FIG. 10 and FIGS. 20 and 21 with FIG. 11.

Namely, the 2-level quantized received signal A of FIG. 11 and the 2-level quantized received signal of FIG. 20 are the same. The output A of the D flip-flop array 202 in FIG. 11 varies from "7" to "9", while the output of the D flip-flop array 404a in FIG. 20 varies gradually from "7" to "8" to "9". Similarly, the 2-level quantized received signal B of FIG. 11 and the 2-level quantized received signal of FIG. 21 are the same. The output B of the D flip-flop array 202 in FIG. 11 varies from "9" to "7", while the output of the D flip-flop array 404a in FIG. 21 varies gradually from "9" to "8" to "7". The updating rate of the relative phase signal is doubled for the circuit of FIG. 18, and hence the variation of the value of the relative phase signal is rendered less abrupt.

The operations of the delay element 40, the subtractor 41, and the decision circuit 42 of FIG. 18 are the same as those of the corresponding parts described in FIG. 9.

The above description relates to the case where the received signal is modulated in accordance with the differential phase shift keying (DPSK). However, the principle embodied in the circuit of FIG. 18 can be applied to MSK or GMSK modulation systems. Further, in the case of the above embodiment, the constant M serving as the operation parameter of the phase detection circuit 400a is equal to 4 (M=4). However, the constant M may be any positive integer. For example, M may be five (M=5) or six (M=6).

What is claimed is:

1. A differential detection demodulator for demodulating a 2-level quantized received signal using a 2-level phase reference signal having a fixed frequency practically equal to a frequency of said received signal, said differential detection demodulator comprising:

a phase comparator including:
an exclusive OR element having a first input which receives the received signal and a second input which receives the phase reference signal, for obtaining a logical exclusive OR of said received signal and said phase reference signal and for outputting an exclusive OR signal;
absolute phase shift measurement means having an input coupled to an output of said exclusive OR element, for determining a duration in which the said exclusive OR signal is sustained at a logical "1" during each half period of said phase reference signal, and for outputting an absolute phase shift signal;
phase shift polarity decision means having an input coupled to the output of said exclusive OR element, for deciding whether said phase of said received signal leads or lags said phase reference signal at each half period of said phase reference signal, and for outputting a phase shift polarity signal; and
wherein a combination of said absolute phase shift signal and said phase shift polarity signal is a relative phase signal output from said phase comparator;
a delay element having an input coupled to an output of said phase comparator, for delaying said relative phase signal output from said phase comparator by one symbol period of said received signal, and for outputting a delayed signal; and
a subtracter having an input coupled to the output of said phase comparator and an input coupled to an output of said delay element, for subtracting the delayed signal from said relative phase signal.

2. A differential detection demodulator as claimed in claim 1, wherein said absolute phase shift measurement means comprises:
an adder having an input coupled to said output of said exclusive OR element which adds said exclusive OR signal and delayed added signal to obtain a value corresponding to said duration in which said output of said exclusive OR element is sustained at a logical "1" during each half period of said phase reference signal, and for outputting said value; and
a delay element having an input coupled to an output of said adder and having an output coupled to a second input of said adder, said delay element delaying said output value of said adder in synchronism with a clock signal having a period shorter than said period of said phase reference signal, said delay element being reset at each half period of said phase reference signal.

3. A differential detection demodulator for demodulating a 2-level quantized received signal, said differential detection demodulator comprising:
a frequency converter circuit, including:
an exclusive OR element having a first input for receiving the received signal and a second input for receiving a quantized frequency conversion signal, for obtaining a logical exclusive OR of said received signal and said frequency conversion signal and for outputting an exclusive OR signal;

running average generator means, having an input coupled to an output of said exclusive OR element, for generating a signal corresponding to k times a running average of said exclusive OR signal, where k is a positive integer and for outputting a running average signal; and hard decision means, having an input coupled to an output of said running average generator means, for converting said running average signal to a 2-level logical signal and for outputting said 2-level logical signal;

a phase comparator including:

an exclusive OR element having a first input which receives the 2-level logical signal and a second input which receives a phase reference signal, for obtaining a logical exclusive OR of said 2-level logical signal and said phase reference signal and for outputting an exclusive OR signal;

absolute phase shift measurement means having an input coupled to an output of said exclusive OR element, for determining a duration in which the said exclusive OR signal is sustained at a logical "1" during each half period of said phase reference signal, and for outputting an absolute phase shift signal;

phase shift polarity decision means having an input coupled to the output of said exclusive OR element, for deciding whether said phase of said received signal leads or lags said phase reference signal at each half period of said phase reference signal, and for outputting a phase shift polarity signal; and wherein a combination of said absolute phase shift signal and said phase shift polarity signal is a relative phase signal output from said phase comparator;

a delay element having an input coupled to an output of said phase comparator, for delaying said relative phase signal by one symbol period of said received signal, and for outputting a delayed signal; and a subtracter having an input coupled to the output of said phase comparator and an input coupled to an output of said delay element, for subtracting the delayed signal from said relative phase signal.

4. A differential detection demodulator as claimed in claim 3, wherein said running average generator means comprises:

a shift register coupled to said output of the exclusive OR element, the shift register having (2n+1) stages to hold respective bits of the exclusive OR signal, where n is a positive integer and said exclusive OR signal is first supplied to a first stage of said shift register, said shift register shifts said bits held in said stages from said first stage toward a (2n+1)th stage in synchronism with a clock signal having a period substantially shorter than periods of said received signal and said frequency conversion signal; and an adder means having (2n+1) inputs coupled to (2n+1) outputs of said shift register, for adding bits of said respective stages of said shift register, wherein an output of said adder is the output of said running average generator means.

5. A differential detection demodulator as claimed in claim 3, wherein said running average generator means comprises:

a shift register coupled to said output of the exclusive OR element, the shift register having (2n+2) stages to hold respective bits of the exclusive OR signal, where n is a positive integer and said exclusive OR signal is first supplied to a first stage of said shift register, said shift register shifting said bits held in said stages from said first stage toward a (2n+2)th stage in synchronism with a clock signal having a period shorter than periods of said received and frequency conversion signals;

a sign inverter having an input coupled to an output of the (2n+2)th stage of said shift register, for inverting a polarity of an output bit;

an adder having an input coupled to an output of said first stage of said shift register, an input coupled to an output of said sign inverter and an input for receiving a delayed added signal, which adds outputs of said first stage of said shift register, said sign inverter, and said delayed added signal, and outputs an added signal; and a delay element having an input coupled to an output of said adder and having an output coupled to an input of said adder, said delay element delaying said output of said adder in synchronism with said clock signal.

6. A differential detection demodulator as claimed in claim 3, wherein said hard decision means compares said running average generator signal with a predetermined threshold level to convert said running average generator signal to said 2-level logical signal.

7. A differential detection demodulator as claimed in claim 3, wherein said absolute phase shift measurement means comprises:

an adder having an input coupled to said output of said exclusive OR element, which adds said exclusive OR signal and a delayed added signal to obtain a value corresponding to said duration in which said output of said exclusive OR element is sustained at a logical "1" during each half period of said phase reference signal, and for outputting said value; and a delay element having an input coupled to an output of said adder and having an output coupled to a second input of said adder, said delay element delaying said output value of said adder in synchronism with a clock signal having a period shorter than said period of said phase reference signal, said delay element being reset at each half period of said phase reference signal.

8. A differential detection demodulator for demodulating a quantized received signal, comprising:

a phase comparator including:

a multiplier having an input for receiving said quantized received signal and a second input for receiving a phase reference signal, which multiplies the received signal and the phase reference signal, and which outputs a multiplied signal; and a phase detector having an input coupled to an output of the multiplier for determining a phase of the quantized received signal and for outputting a detected phase signal;

a phase difference calculator circuit having an input coupled to an output of the phase detector, for determining a phase difference of the quantized received signal during one symbol period of the quantized received signal, and for outputting a phase difference signal; and a decision circuit having an input coupled to an output of the phase difference calculator circuit for determining demodulated data from the phase difference signal and for outputting the demodulated data.

9. The differential detection demodulator as claimed in claim 8, wherein the phase difference calculator circuit comprises:
  a delay element having an input coupled to the output of the phase detector, for delaying said phase detected signal by one symbol of said received signal, and for outputting a delayed signal; and
  a subtracter having an input coupled to the output of said phase detector circuit and an input coupled to an output of said delay element, for subtracting the delayed signal from the phase detected signal, and for outputting the phase difference signal.

10. A differential detection demodulator for demodulating a quantized received signal, comprising:
  a frequency converter circuit for converting a frequency of the quantized received signal, including:
    an exclusive OR element having a first input which receives the quantized received signal and a second input which receives a quantized frequency conversion signal of a second frequency, which multiplies the received signal with the frequency conversion signal, and outputs a multiplied signal;
    a running average generator circuit having an input coupled to an output of the exclusive OR element which receives the multiplied signal, which generates a running average of the multiplied signal, and which outputs a filtered signal; and
    a comparator having an input coupled to an output of the running average generator circuit which receives the filtered signal, and converts the filtered signal into a frequency converted quantized signal;
  a phase comparator, including:
    a multiplier having an input for receiving the frequency converted quantized signal and a second input for receiving a phase reference signal, for multiplying the frequency converted quantized signal and the phase reference signal, and for outputting a multiplied signal; and
    an absolute phase shift measurement circuit having an input coupled to an output of said multiplier, for determining an absolute phase of the frequency converted quantized signal, and for outputting a detected phase signal;
    a phase shift polarity circuit having an input coupled to the output of the multiplier for receiving the multiplied signal, for determining whether said frequency converted quantized signal leads or lags the phase reference signal, and for outputting a phase polarity signal, and
    wherein a combination of the phase polarity signal and the detected phase signal comprise a relative phase shift of the frequency converted quantized received signal to the phase reference signal; and
  a phase difference calculator circuit having an input coupled to an output of the phase comparator, for determining a phase difference of the frequency converted received signal during one symbol period of the quantized received signal, and for outputting a phase difference signal.

11. The differential detection demodulator as claimed in claim 10, wherein the phase difference calculator circuit comprises:
  a delay element having an input coupled to the output of the phase comparator, for delaying the phase detected signal by one symbol period of the quantized received signal, and for outputting a delayed signal; and
  a subtracter having an input coupled to the output of the phase comparator and an input coupled to an output of the delay element, for subtracting the delayed signal from the detected phase signal, and for outputting the phase difference signal.

12. A phase comparator for determining a phase shift of a quantized received signal relative to a phase reference signal, comprising:
  a multiplier for receiving the received signal and the phase reference signal, for multiplying the received and the phase reference signals and for outputting a multiplied signal;
  a phase shift measurement circuit having an input coupled to an output of said multiplier, for determining a phase shift of the multiplied signal, and for outputting an absolute phase shift signal;
  a phase shift polarity determiner circuit for receiving the multiplied signal, for determining whether the multiplied signal leads or lags the phase reference signal, and for outputting a phase shift polarity signal wherein a combination of the phase shift polarity signal and the absolute phase shift signal comprise the relative phase shift of the received signal to the phase reference signal;
  a phase difference calculator circuit having an input coupled to an output of the phase comparator, for determining a phase difference of the quantized received signal during one symbol period of the quantized received signal, and for outputting a phase difference signal; and
  a decision circuit having an input coupled to an output of the phase difference calculator circuit for deciding a demodulated data from the phase difference signal and for outputting the demodulated data.

* * * * *